United States Patent [19]
Voorhees et al.

[11] Patent Number: 5,946,471
[45] Date of Patent: Aug. 31, 1999

[54] METHOD AND APPARATUS FOR EMULATING LABORATORY INSTRUMENTS AT REMOTE STATIONS CONFIGURED BY A NETWORK CONTROLLER

[75] Inventors: Robert Thomas Voorhees; Paul Ardeshir McKenzie; Estel Dean Sprague, all of Cincinnati, Ohio

[73] Assignee: University of Cincinnati, Cincinnati, Ohio

[21] Appl. No.: 08/693,753

[22] Filed: Aug. 7, 1996

Related U.S. Application Data

[60] Provisional application No. 60/002,111, Aug. 10, 1995.

[51] Int. Cl.⁶ ..................................................... G06F 9/445
[52] U.S. Cl. ............................................................ 395/500
[58] Field of Search ..................................... 395/500, 527

[56] References Cited

U.S. PATENT DOCUMENTS

| | | | |
|---|---|---|---|
| 4,703,433 | 10/1987 | Sharrit | 702/76 |
| 4,816,767 | 3/1989 | Cannon et al. | 324/601 |
| 4,863,223 | 9/1989 | Weissenback et al. | 312/209 |
| 5,037,164 | 8/1991 | Weissenback et al. | 108/50.02 |
| 5,104,621 | 4/1992 | Pfost et al. | 422/67 |
| 5,108,703 | 4/1992 | Pfost et al. | 422/65 |
| 5,121,467 | 6/1992 | Skeirik | 706/10 |
| 5,125,748 | 6/1992 | Bjonnson et al. | 356/414 |
| 5,139,744 | 8/1992 | Kowalski | 422/67 |
| 5,157,665 | 10/1992 | Fakhari-Fard et al. | 371/20.1 |
| 5,206,568 | 4/1993 | Bjonnson et al. | 318/568.1 |
| 5,282,261 | 1/1994 | Skeirik | 706/23 |
| 5,440,699 | 8/1995 | Farrand et al. | 395/155 |
| 5,630,164 | 5/1997 | Williams et al. | 395/500 |
| 5,649,171 | 7/1997 | Craven et al. | 395/500 |
| 5,671,355 | 9/1997 | Collins | 395/200.2 |

FOREIGN PATENT DOCUMENTS

| | | |
|---|---|---|
| 471442 | 8/1990 | European Pat. Off. . |
| 4142453 | 2/1993 | Germany . |
| 4103059 | 6/1993 | Germany . |
| 04287596 | 3/1991 | Japan . |
| 540210 | 9/1975 | U.S.S.R. . |
| 636638 | 12/1975 | U.S.S.R. . |
| 2160666 | 2/1993 | United Kingdom . |
| WO15959 | 9/1992 | WIPO . |

Primary Examiner—Kevin J. Teska
Assistant Examiner—Ayni Mohamed
Attorney, Agent, or Firm—Frost & Jacobs LLP

[57] ABSTRACT

An improved laboratory instrument emulation network system is provided having instrument emulation stations and an instrument emulation network controller in which the emulation network system allows communication between the network controller and each instrument emulation station along a bi-directional, high-speed serial data communications network. The network system allows users at each emulation station to configure the station so as to emulate a certain instrument, i.e., voltmeter, pH meter, temperature meter, etc. The system performs real-time acquisition of raw data at each emulation station, transmits the raw data to the network controller in near-real time where it is converted into engineering units (e.g., volts, units of pH, degrees Celsius), then returns the converted data to the respective station and displays the data in either graphical or numerical format (or both), as the user selects. The converted data can also be transmitted to other emulation stations, if desired. A personal computer can be connected into the system to transfer data and software, in which laboratory station configuration software can be downloaded from the personal computer, and acquired data can be uploaded from the network controller.

19 Claims, 24 Drawing Sheets

METHOD AND APPARATUS FOR EMULATING LABORATORY INSTRUMENTS AT REMOTE STATIONS CONFIGURED BY A NETWORK CONTROLLER

This application claims the benefit of U.S. Provisional Application No. 60/002,111, filed on Aug. 10, 1995.

TECHNICAL FIELD

The present invention relates generally to scientific instrumentation equipment and is particularly directed to scientific laboratory instrumentation of the type which enables the function of various scientific instruments to be emulated or replicated without the need to purchase, install, interconnect, and test, individual various scientific instruments. The invention is specifically disclosed as a method and apparatus for measuring various physical parameters by providing a network controller which performs and controls the acquisition and display of data at a plurality of laboratory stations simultaneously.

BACKGROUND OF THE INVENTION

The typical university chemistry laboratory operates under several constraints which render it unable to simulate the experiences of a professional chemist. One such constraint involves the cost of purchasing measurement instrumentation. The laboratory must service a large number of students and, due to the nature of the experiments, must provide each individual student taking a laboratory course with a separate set of instruments. Thus, a laboratory will stock multiple numbers voltmeters, pH meters, spectrometers, etc. at a large cost to the institution.

High-level research and private industry laboratories routinely employ computer systems to acquire, store, and manipulate data. This option has been generally unfeasible for the university chemistry laboratory. Most current data acquisition systems require a personal computer interfaced to an instrument-emulation device placed at every station; in a large laboratory, this becomes prohibitively expensive, underutilizes the power of the personal computer, and occupies too much valuable laboratory counter space.

The advent of high-speed communication systems has made it possible to network multiple data collection instruments to a single personal computer. However, these systems typically provide only unidirectional communication from the instrument to the personal computer. Display of data at the individual stations is limited to a numerical representation of the instrument reading. More advanced display of data, such as graphical displays and viewing of data from multiple stations, are typically generated only at the personal computer. These limitations of the known art present significant difficulties in their use in a university chemistry laboratory. It is advantageous for students to view a graphical representation of data at their individual lab stations so that they may analyze trends and easily monitor measurements. Also, cooperative learning is enhanced by efficiently pooling data and providing pooled results for students' viewing.

SUMMARY OF THE INVENTION

Accordingly, it is a primary object of the present invention to provide a laboratory instrument emulation network with the ability to allow many users to acquire, store, and manipulate data at the same time.

It is also an object of the present invention to provide a laboratory instrument emulation network that includes instrument emulation stations which acquire data and display results, an instrument emulation network controller, and a high speed communications network that transfers acquired data between the instrument emulation stations and the network controller.

It is yet another object of the present invention to provide an instrument emulation network controller which has the ability to configure each instrument emulation station to make user-selected measurements, wherein the individual stations can perform measurements of different physical parameters at the same time.

It is a further object of the present invention to provide an instrument emulation network controller that monitors the instrument emulation stations, performs all necessary calculations on data sent to it by each station, and sends back appropriate results in proper format for display.

It is yet a further object of the present invention to provide an instrument emulation network controller that can store data in memory for later use and can transfer that data to a personal computer via an RS232 serial port.

Yet another object of the present invention is to provide instrument emulation stations that each include a display which displays acquired data in both textual form and graphical form, and which is updated by the network controller in real time.

Additional objects, advantages and other novel features of the invention will be set forth in part in the description that follows and in part will become apparent to those skilled in the art upon examination of the following or may be learned with the practice of the invention.

To achieve the foregoing and other objects, and in accordance with one aspect of the present invention, an improved laboratory instrument emulation network system is provided having instrument emulation stations and an instrument emulation network controller. The emulation network system is configured to allow communication between the network controller and each instrument emulation station along a bi-directional, high-speed serial data communications path known as the station network. The network system allows users at each emulation station to configure the station so as to emulate a certain instrument, i.e., voltmeter, pH meter, temperature meter, etc. The system performs real-time measurement of raw data at each emulation station, transmits the raw data to the network controller where it is converted (typically into engineering units), then returns the converted data to the respective station and displays the data in either graphical or numerical format, or both, as the user selects. The converted data can also be transmitted to other emulation stations, if desired. In addition, a personal computer can interact with the system via an RS-232 driver to transfer data and software in which laboratory station configuration software can be downloaded from the personal computer, and acquired data can be uploaded from the network controller.

Acquisition of raw data at the emulation system occurs in real time, while the display of the converted data occurs in near-real time. The network controller is run by a high-speed microcontroller, which performs various routines according to software instructions stored in the controller's erasable programmable read only memory. The network controller communicates with each emulation station through a controller area network (CAN) module which manages all interaction of the emulation stations and the network controller. Optionally, the network controller can be expanded to include a graphic display and a keypad to facilitate programming and control by a system operator. In addition, custom applications can be stored in the network controller's battery backed-up random access memory, or can be plugged into the network controller as a hardware module through the controller's PCMCIA slot.

The network controller's operating system is multi-tasking in nature, in which the operating kernel inspects incoming data and tasks while determining the priority level and performance sequence of each task. Among the highest priority tasks are the acquisition and conversion of raw data acquired from each emulation station into a usable format, and transmittal of the converted data back to the respective emulation system for display. Messages from the emulation stations include the station identification number and type of message. The operating system will assign specific tasks ranging from "system module" tasks to routines or tasks in "personality modules" according to the type of message received from the emulation stations. There is a single personality module for each type of device that a station can emulate. Each emulation station is assigned a station status register and memory space for bulk data storage. Each station status register contains information necessary for the operating system to control and characterize each emulation station as the user defines from a list of choices provided in a main menu at the station.

Each emulation station is controlled by a central processing unit which facilitates communications with the network through a controller area network (CAN) module. Each station further contains an analog-to-digital converter for the acquisition of data; a first-in-first-out memory which is a buffer for display data that acts with a second central processing unit to retrieve and display data; a third central processing unit which encodes the emulation station keypad inputs as well as handles the station's power-up sequence; and a communications bus which facilitates interaction among these elements. In addition, an instrument interface expansion port provides the capability to interface to more complex measurement and control systems.

Still other objects of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE PREFERRED EMBODIMENT

Reference will now be made in detail to the present preferred embodiment of the invention, an example of which is illustrated in the accompanying drawings, wherein like numerals indicate the same elements throughout the views.

Figure 1:
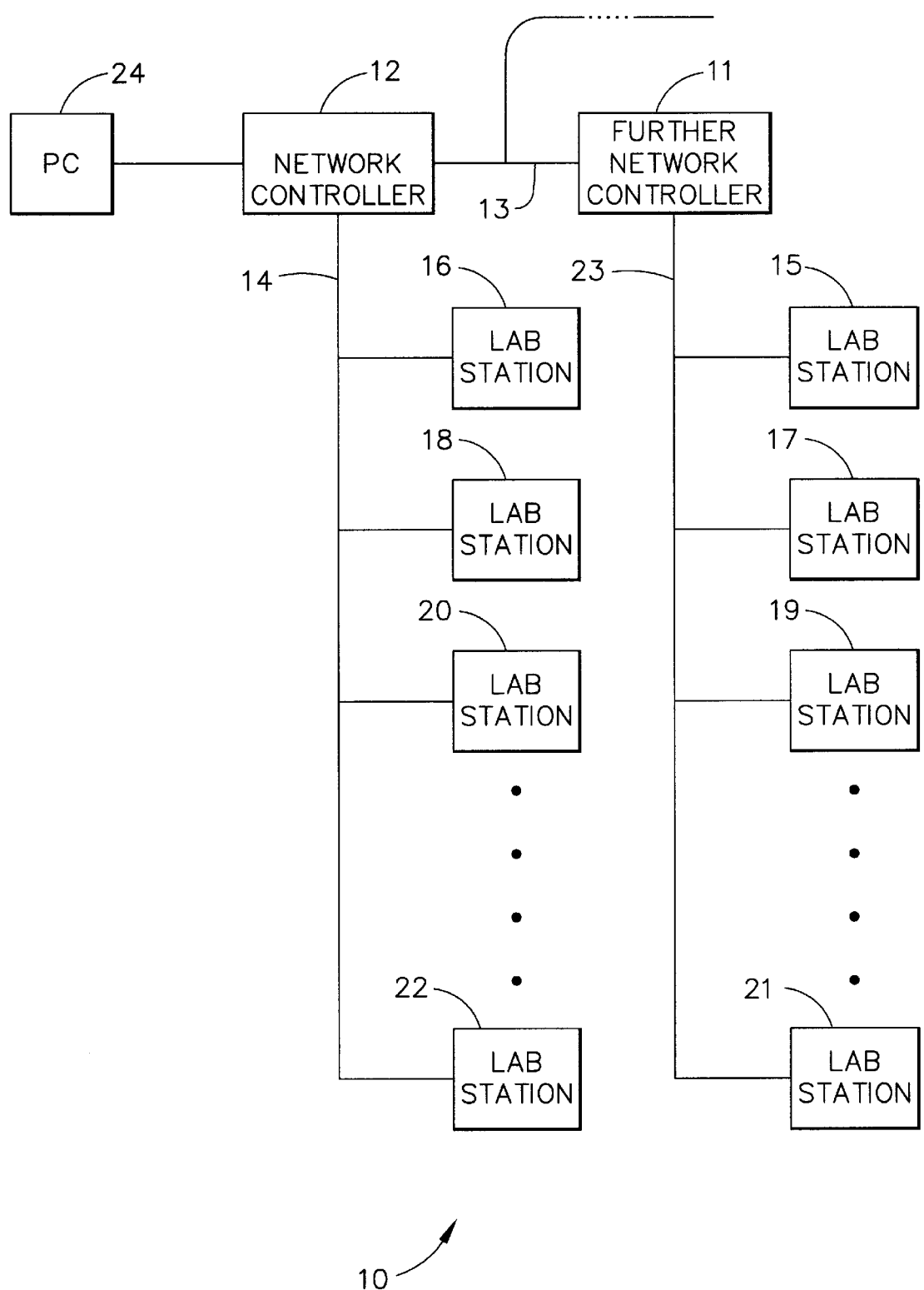
FIG. 1 is a diagram of the layout and interconnection of instrument emulation network controllers and instrument emulation laboratory stations which together form an instrument emulation network system constructed according to the principles of the present invention.

Referring now to the drawings, FIG. 1 depicts an instrument network emulation system generally designated by the index numeral 10 which includes network controller units 11 and 12, laboratory stations 16, 18, 20, and 22 on one network, and laboratory stations 15, 17, 19, and 21 on a second network. A bi-directional, high-speed serial data communications path 14 is used as a network to allow the instrument network controller 12 and laboratory stations 16, 18, 20, and 22 to communicate to one another.

A second, similar network 23 is used to allow communications between the "further" network controller 11 and its associated laboratory stations 15, 17, 19, and 21, while a third similar "controller" network 13 provides a communications link between network controllers 11 and 12, and perhaps to other such controllers not seen in FIG. 1. Laboratory stations 15–22 may be configured to emulate different instruments, as for example, laboratory station 16 may be configured to be a voltmeter while laboratory station 18 is configured as a pH meter. A personal computer 24 may be connected to the network controller 12 in order to upload or download software or data therebetween, and personal computer 24 could be configured to also similarly communicate with network controller 11.

Figure 2:
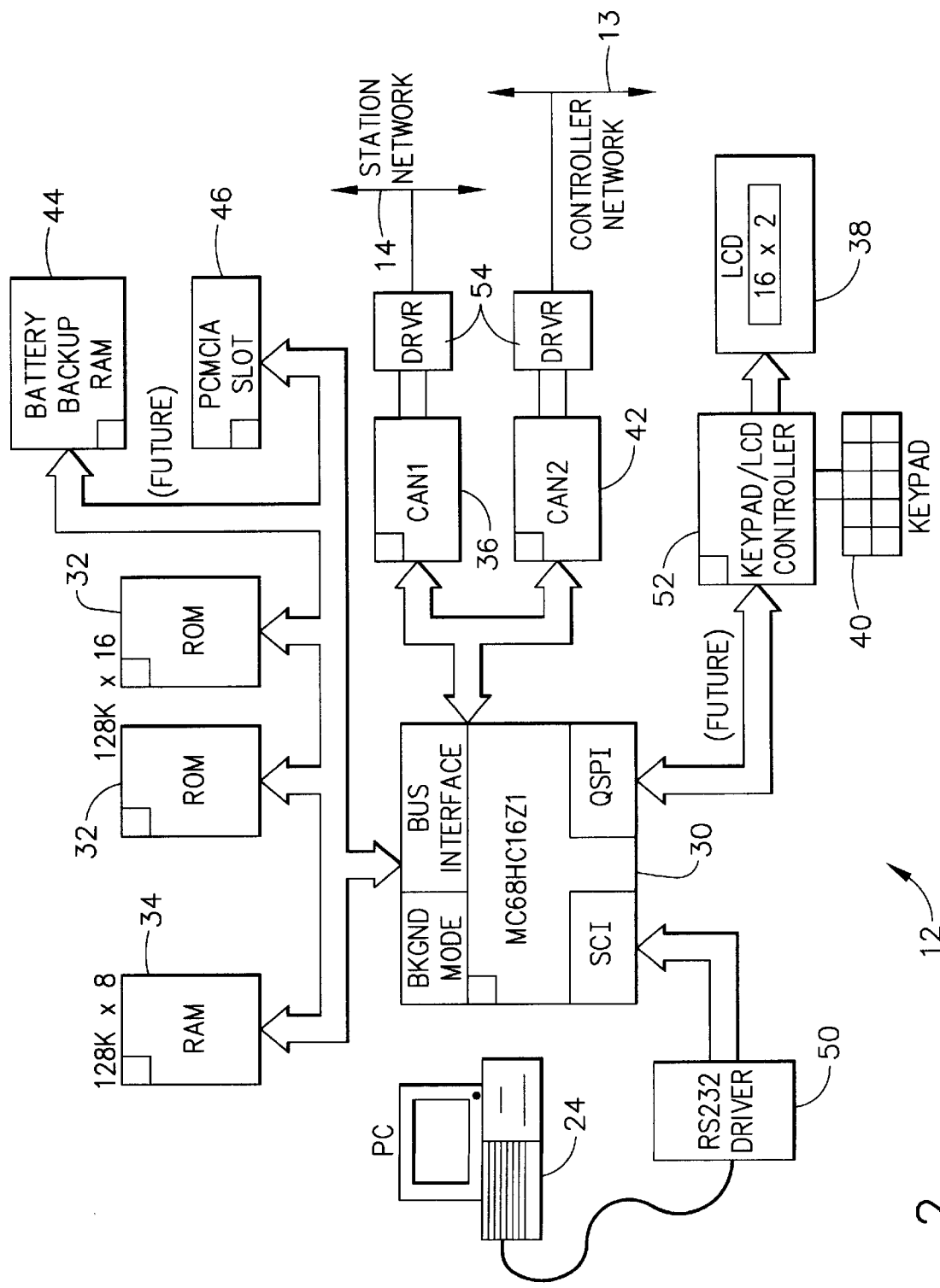
FIG. 2 is a schematic block diagram depicting the circuitry of the instrument emulation network controller of FIG. 1.

FIG. 2 depicts the circuitry of instrument emulation network controller 12 in block diagram form. In the illustrated embodiment, the network controller 12 comprises a high-speed microcontroller 30, erasable programmable read only memory (ROM) 32, random access memory (RAM) 34, and a controller area network module 36. The controller area network module 36 manages all interaction of the laboratory stations and the network controller via a driver/receiver circuit 54 connected to network 14. Personal computer 24 communicates via an RS-232 driver 50 to transfer data and software in which laboratory station configuration software can be downloaded from personal computer 24, and acquired data can be uploaded from network controller 12. Microcontroller 30 preferably is a Part Number MC68HC16Z1, manufactured by Motorola Corporation. RAM 34 preferably is an integrated circuit having a memory capacity of 128K×8, and ROM 32 preferably comprises two EPROM integrated circuits, each having a memory capacity of 128K×16. It will be understood that other memory configurations could be used in network controller 12 without departing from the principles of the present invention.

A Controller Area Network (CAN) protocol integrated circuit, designated by the index numeral 36 (i.e., for CAN1) is used to communicate with the laboratory stations via network 14. The CAN protocol has been developed by Robert Bosch GmbH, and comprises a multicast, broadcast, or peer-to-peer network, which is a serial half-duplex communications bus (i.e., when one CAN chip on the network transmits, all other CAN chips receive) that can communicate at baud rates up to 1 MBit/sec. The preferred CAN1 chip is an integrated circuit manufactured by Intel, having the part number 82527, which implements the CAN Specification 2.0, which is a message-based protocol, in which each message contains a 29-bit message identifier, a 15-bit CRC (i.e., a cyclic redundant check) for error checking, eight (8) bytes of data, and a few other control bits. The CAN protocol does not specify the physical layer, which in the illustrated embodiment uses an RS-485 driver along with a shielded, twisted pair for connection to the bus.

A second controller area network module (a CAN device) designated CAN2 and by the index numeral 42 may be added to link multiple networks (via network 13), thereby allowing a single personal computer 24 to communicate to a larger number of laboratory stations 15–22. Preferably, CAN2 also comprises an Intel 82527 integrated circuit, and optionally allows numerous networks (each, e.g., having one network controller and up to ten (10) laboratory stations) to be linked together to form one large network that can be serviced by a single personal computer 24.

Network controller 12 includes the capability to be expanded with a number of optional features, including a liquid crystal display 38 and a user input device such as a keypad 40, which are both controlled by a single controller module 52. Display 38 preferably is a 16×2 liquid crystal display, and keypad 40 preferably is 4×4 keypad. A battery backup RAM 44 can be added to allow for custom applications that could be developed by the user at the personal computer 24. Similarly, a PCMCIA slot 46 allows for custom applications to be plugged into the network controller, such as commercially-developed software or hardware modules.

In the illustrated embodiment, the preferred devices for use in network controller 12 are as follows: for RAM 34, a part number TC55257BPL-10L; for ROM 32, a part number DS12454-120; for driver 54, a part number MAX483 made by Maxim; and for the RS-232 port 50, a part number MC145407P.

Figure 3:
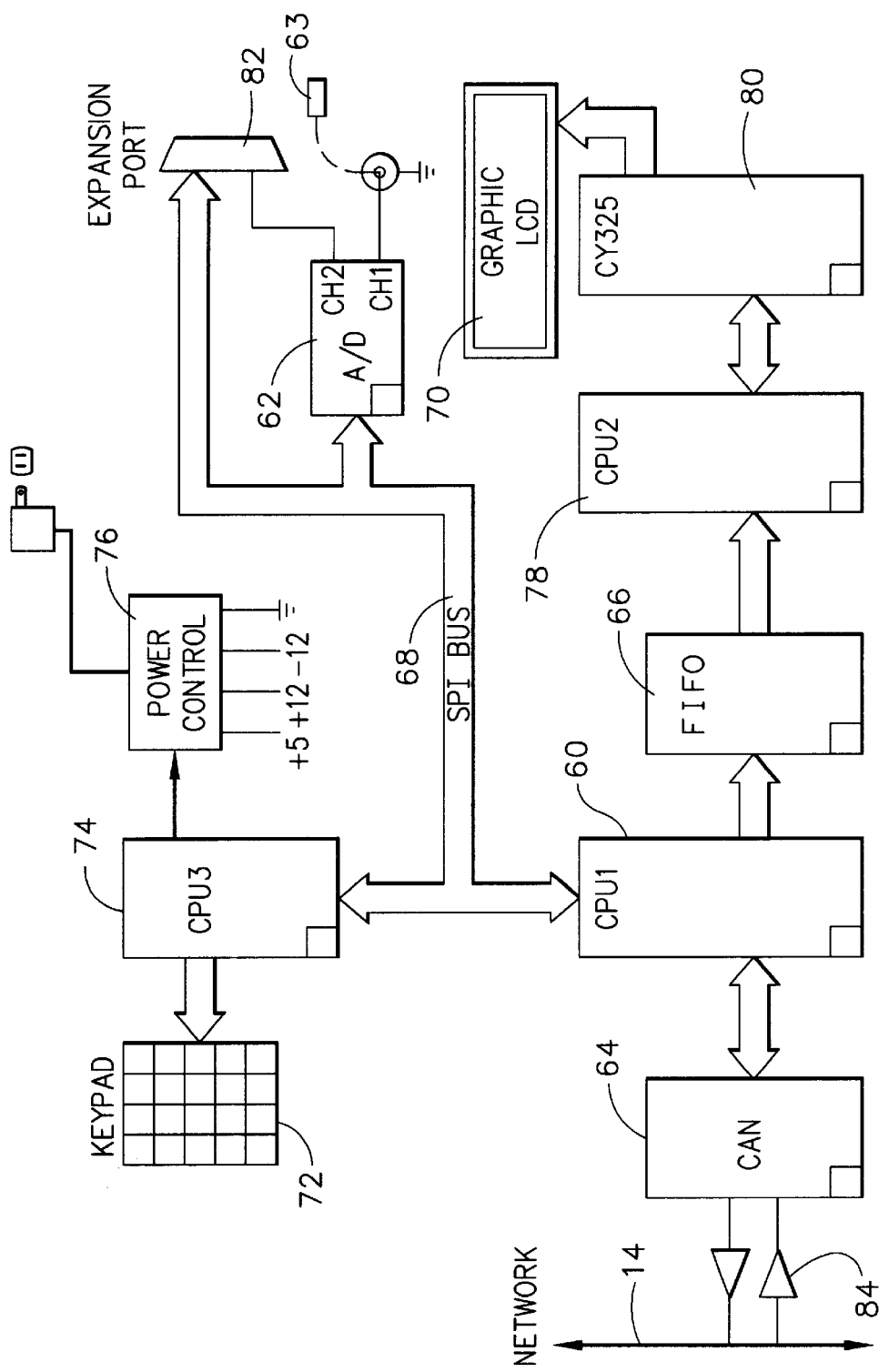
FIG. 3 is a schematic block diagram depicting the circuitry of an instrument emulation laboratory station of FIG. 1.

FIG. 3 depicts the circuitry of one of the laboratory stations 16–22 in block diagram form. In the illustrated embodiment, a laboratory station such as depicted by index numeral 16 comprises a central processing unit (CPU1) 60 which controls communications with the network 14 via a driver/receiver circuit 84, an analog-to-digital (A/D) converter 62, a controller area network module (CAN) 64, first-in-first-out memory (FIFO) 66, and a communications bus 68. A user interacts with laboratory station 16 via a graphic display 70 and a keypad 72. A second central processing unit (CPU2) 78 is responsible for retrieving data to be displayed from FIFO 66 and sending it to a graphics display controller (Model Number CY325) 80. Because the graphics display is relatively slow, CPU2 78 and FIFO 66 act as a buffer to temporarily hold the large amount of data ultimately to be displayed. A third central processing unit (CPU3) 74 serves dual purposes, including as a custom keypad decoder for keypad 72, and to handle the station's power-up sequence via its connection to a power control unit 76. An instrument interface expansion port 82 provides the capability to interface to more complex measurement and control subsystems.

In the illustrated embodiment, the preferred devices for use in laboratory station 16 are as follows: for CPU3 74, a part number PIC16C57 made by Microchip Technology Inc.; for CAN 64, a part number AN82527 made by Intel; for CPU1 60, a part number MC68HC705C8 made by Motorola; for FIFO 66, a part number DS2011-120 made by Dallas Semiconductor; for CY325 80, a part number CY325B made by Cybernetic Micro Systems; for LCD 70, a part number DMF5005N made by Optrex; for A/D Converter 62, a part number AD7710AN made by Analog Devices; for the 0–9 keys portion 514 of keypad 72, a part number 87FC3-201 made by Grayhill; and for Network Driver 84, a part number MAX483 made by Maxim.

Figure 4A:
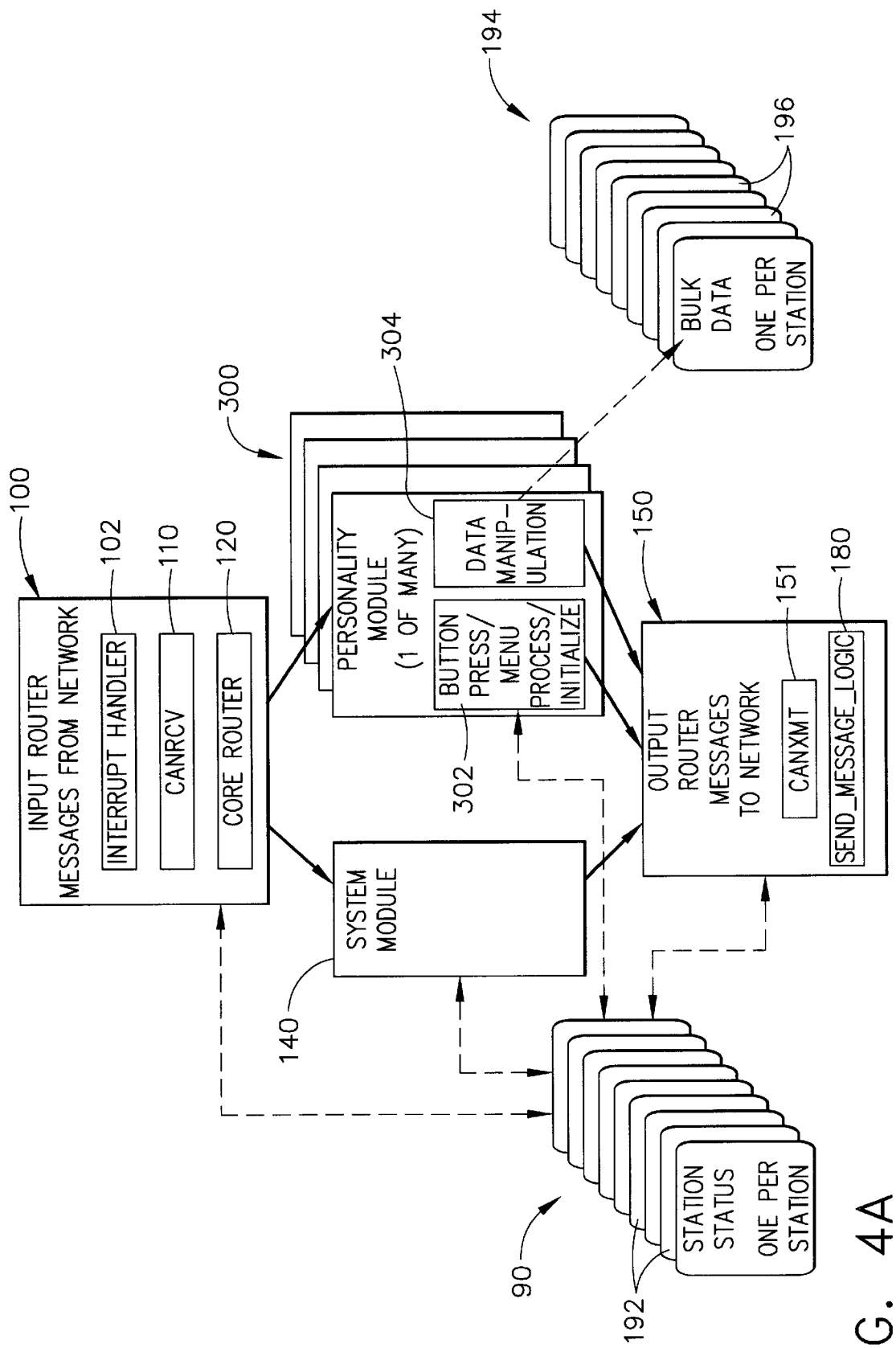
FIGS. 4A–4G are flow charts depicting a portion of the operating decisions of and controlling method of the instrument emulation network controller of FIG. 2.

The operational steps of an exemplary laboratory instrument network controller 12 are depicted in flow chart form in FIG. 4A. The hardware depicted in FIG. 2 includes a microcontroller 30 which performs according to software instructions preferably contained in ROM 32. The operating system of network controller 12 preferably is multi-tasking in nature, in which the operating kernel (not shown) initializes the appropriate tasks (or modules) depicted on FIG. 4A and sets their priority levels. The kernel then determines which tasks are ready to be serviced, and then performs the most urgent tasks first.

An input router task 100 handles messages from the network 14 and stores input data in the correct station status register (or buffer) 190. Input router 100 includes an interrupt handler 102 which is a hardware service routine, a task known as "CANRCV" designated by the index numeral 110, which is a network message handler, and a task designated "core router" 120, which controls the routing of incoming messages to the appropriate tasks.

Messages from stations 16, 18, 20 or 22 typically include the station identification number and type of message, such as "system," "button," and "data." Upon receiving a "system" message, input router 100 will send a message to the mailbox of a system module task 140 with a message including a pointer to the appropriate station status structure 192, which comprises one group of registers of several such groups, collectively depicted at index numeral 190. When a "button" or "data" message is received, input router 100 will send a message to the mailbox of a task in one of the personality modules 300, such as module tasks 302 or 304 indicated by a pointer stored in the appropriate station status structure 192.

There is one station status structure 192 for each station connected to the network 14. Each station status structure 192 contains a profile of its corresponding station, including what device type the station is emulating (such as a voltmeter, pH meter, temperature meter, etc.), or a combination of possible configurations; which step in the personality module the station is performing (such as initialization, calibration, data acquisition, graphing, or data downloading); current calibration constants; the status of any messages being sent to the station 16 associated with this status structure 192 according to an output router task 150; and the location in bulk data storage 194 at which the next input data will be stored. Any other constants or pointers needed by the system and the station will be stored at the appropriate station status structure 192 as well.

System messages are routed directly to system module 140, and preferably include the power-up of a station, a reset of a station, or any messages from a station indicating faults or failures of components. A power-up or reset will initiate a series of steps, including testing of the communications link, operability of hardware at the station, and other such steps. A task pointer (not shown) in station status structure 192, that keeps track of which function in which personality module is currently being performed, is initialized after which a menu of available personalities or choices is sent to the station for display. After a first level of selection, all further choices and handling of inputs are routed to the appropriate module/function using this task pointer in station status structure 192.

There is one personality module 300 for each type of device that a station 16 can emulate. Such device types include a voltmeter, pH meter, temperature meter, drop counter, etc. Each module 300 includes a set of functions 302 that control the initialization, "button press" process, and "menu select" process for its corresponding laboratory station, and a "data manipulation" set of functions 304. A pointer to the appropriate station's status structure 192 is sent with each message to these functions 302 and 304. Each functional step within these modules uses a task pointer in station status structure 192 to determine which input data to work with, which variables to update, and which station to send output to. Each functional step will also update the task pointer (not shown) in station status structure 192 in the appropriate station status structure so that the next or correct step in this personality module's sequence of functions will be signalled when the station responds.

The button press/menu process 302 portion of a personality module 300 contains a sequence of functions which display a series of menu choices to which the user of the station must respond. This allows the system to configure the station according to the user's responses. If the device being emulated needs to be calibrated, then an additional series of questions are asked. Data is acquired and compared to the user's entries of expected values, and calibration constants are stored in the correct station status structure 192. At the end of this process the station's task pointer (not shown) is usually updated to point to the data manipulation portion 304 of personality module 300.

The data manipulation module 304 is the highest priority path in the system to aid in speeding throughput. Acquisition operations can be started and stopped, data can be stored in bulk data storage 194 (or not), and graphing instructions can be calculated (or not), depending on how the station was configured during the menu select process. The acquisition function of data manipulation module 304 does not change the task pointer (not shown) in station status structure 192 so that continuous acquisition is possible. However, certain button presses will override the continuous acquisition mode and reset the task pointer (not shown) in station status structure 192 to allow reconfiguring of the station. In another possible configuration, real-time data acquisition and hand-entered data can be intermingled and stored as a linked data set.

A separate block of memory designated by the index numeral 196 is set aside in bulk data storage 194 for each laboratory station 15–22 in the system 10 so that data sets can be gathered over relatively long time periods. The data for each laboratory station can be dumped to a personal computer external to the controller (e.g., personal computer 24) for analysis and comparison to data sets collected from other stations.

All tasks or software modules which send messages to the laboratory stations do so via output router 150. The calling function sends a message which includes the location of the data or instructions to be sent and the identification number of the station to which the message is to be directed. The output router 150 then uses the space allotted in the appropriate station status structure 192 to keep track of the progress of sending the message to the correct station. Following message transmission, the calling function is freed to begin processing other requests for service.

Figures 4B, 4C:
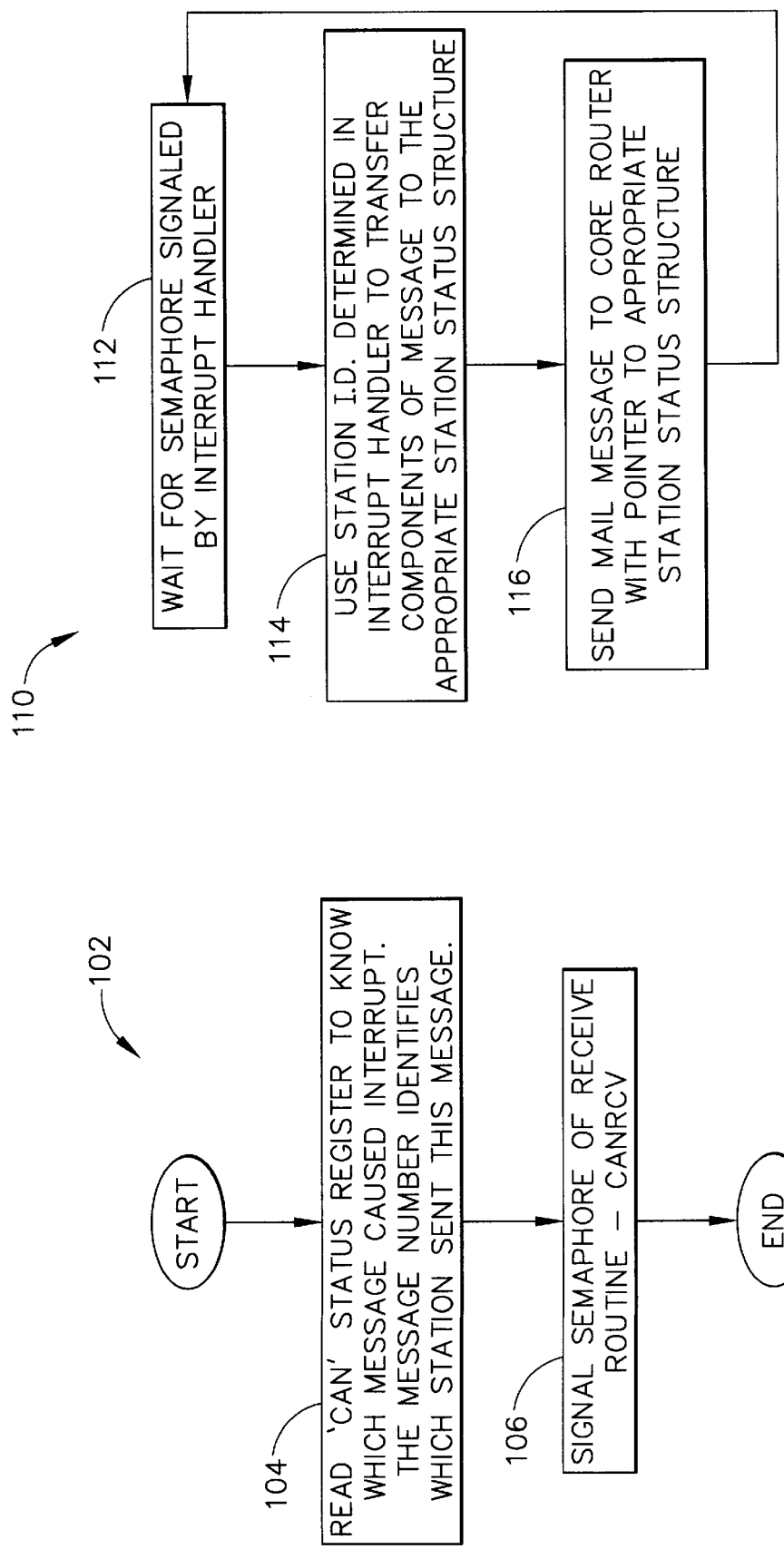

FIG. 4B is a flow chart that describes the functions of the interrupt handler 102, which is used when the CAN1 device receives a message from a laboratory station, and the effect of this routine is to signal the CPU1 60 with an interrupt. The kernel (not shown) activates interrupt handling routine 102, and this determines which "CAN message" (which is a register in the CAN1 module) has received a new message at function block 104. The interrupt handler 102 then signals a semaphore at function block 106 to activate the CAN receive task (CANRCV) 110.

The CAN receive network message handler (CANRCV), designated by the index numeral 110, is a task that uses the laboratory station identification (as determined by function block 104) from which the incoming message was received, and uses the station identification to determine at function block 114 which station status structure is appropriate to store the incoming message after parsing the incoming message into appropriate components. Examples of the types of message categories are as follows: station system status, function key pressed, other type of keyboard key pressed, A/D control, and A/D data. Further message types include a message function, which is dependent upon the appropriate message category; message data, which would contain the function key number of a function key press, an ASCII string value of a menu selection, or a constant value (in the case of a keyboard entry), and A/D acquisition values in the case of an A/D data message. After function block 114 has completed execution, function block 116 sends a mail message to the core router (see FIG. 4D) containing the pointer to the appropriate station status structure. After this has occurred, the CANRCV, being a continuous task, returns back to function block 112 waiting for CANRCV's semaphore to be signalled by the interrupt handler 102.

The mail message sent by function block 116 is received by a function block 124 of the core router task 120 (see FIG. 4D) which is waiting for mail. Decision block 126 then determines whether or not the incoming message category was "system", which was determined earlier in function block 114 as a message category pertaining to the system status. If the answer to this question is YES, the logical flow arrives at the letter "D", which logically flows to FIG. 4E, at a portion of the core router task denoted as "system module", and designated by the index numeral 140 (described in greater detail below). If the incoming message at decision block 126 is not equal to "system", function block 130 determines if the task pointer was equal to "main", which would only occur after a main menu selection has been made at one of the laboratory stations. If the task pointer is now set to main, the logical flow will arrive at function block 134 which selects from a list of possible responses made available to a user who is viewing the main menu at the laboratory station. The list of responses is depicted at function block 134 on the flow chart of FIG. 4D, and this function block sets the task pointer in the appropriate station status structure to point to the initialization/configuration task in the appropriate personality module.

After function block 134 sets the task pointer, decision block 130 will now have a new value for the task pointer, so the NO answer will direct the logic flow to function block 132, which sends a mail message to the appropriate task that has been pointed to by the task pointer. After function block 132 has completed its operations, the logical flow travels through the letter "C", and then arrives at function block 124 where it waits for a new mail message.

Figure 4D:
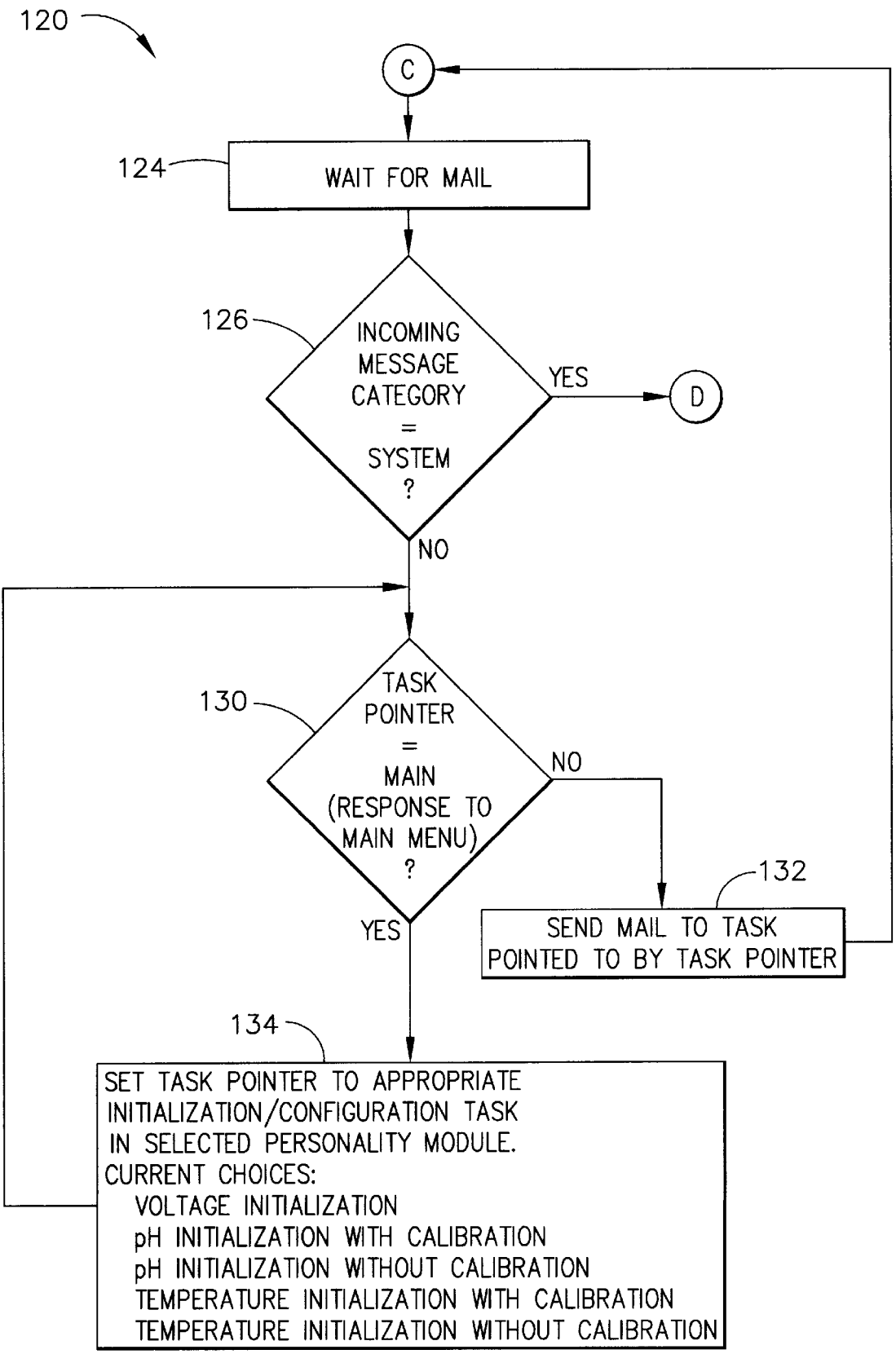
Figure 4E:
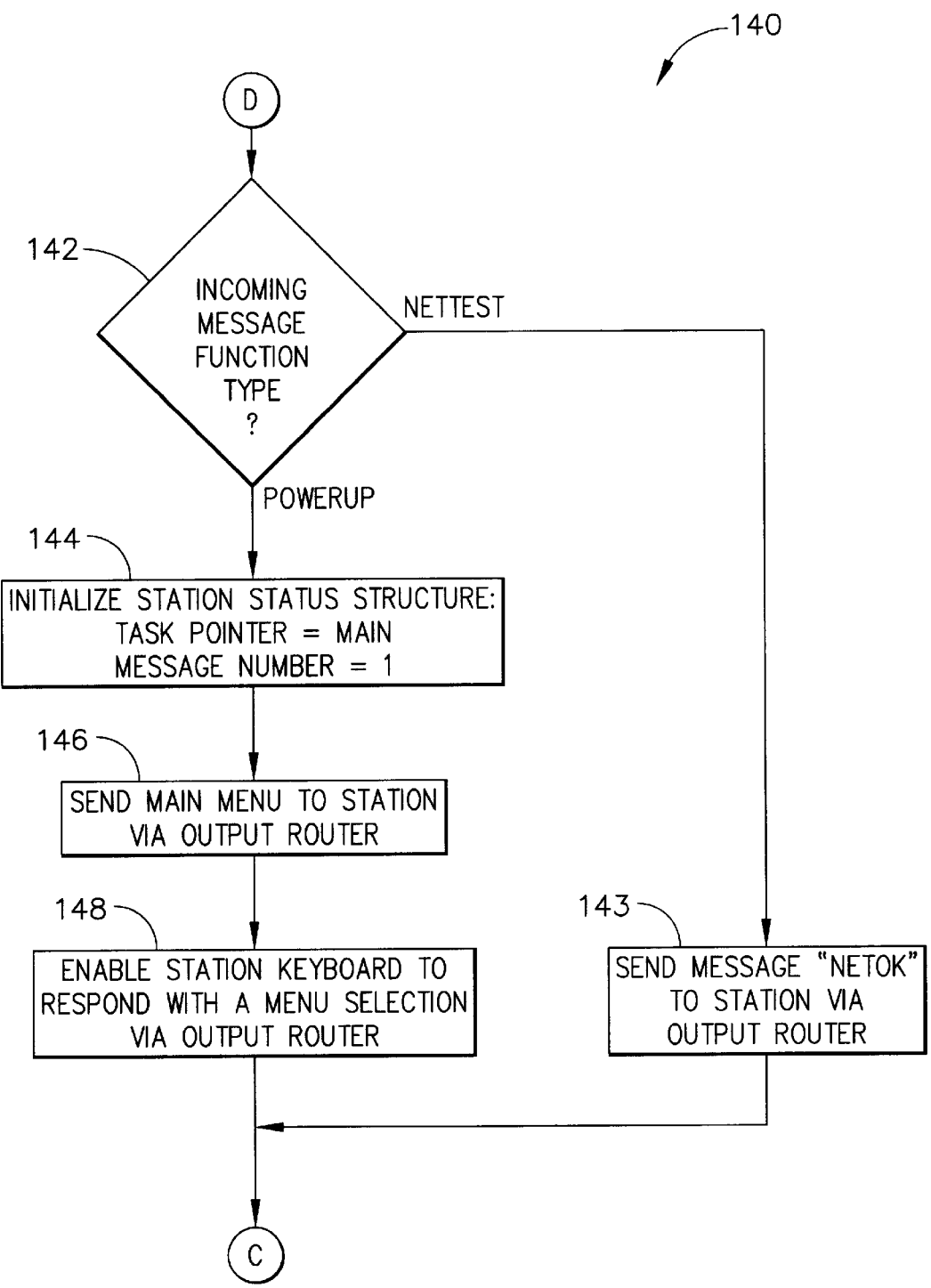

FIG. 4E depicts the logical flow of the portion of the core router task denoted "system module" 140. At decision block 142, the incoming message function type is analyzed, and the two possible choices are "NETTEST" or "POWERUP". If the message function type is NETTEST, the network system is functioning properly, and a "NETOK" message is sent by function block 143 that the network is "okay" to the appropriate laboratory station via the output router 150.

If the incoming message function type is POWERUP, function block 144 initializes the station status structure, which sets the task pointer equal to MAIN, and sets the message number equal to the numeral "1". This would be the normal logic flow after a particular laboratory station has been turned on. At this point, function block 146 sends the main menu display data from the network controller to the appropriate laboratory station via output router 150. The actual data comprising the main menu display is sent from network controller 12 to laboratory station 16, for example, and in the illustrated embodiment, the main menu consists of the choices that are listed on FIG. 4D at function block 134. After the main menu has been displayed at the laboratory station (on graphic LCD 70), function block 148 sends a message via output router 150 to the appropriate laboratory station to enable its station keyboard so that it can respond with menu selections. After that has been accomplished, the logical flow arrives at the letter "C", which directs the logical flow back to FIG. 4D and to the function block 124 under the circumstances where the core router is waiting for new mail messages.

Figure 4F:
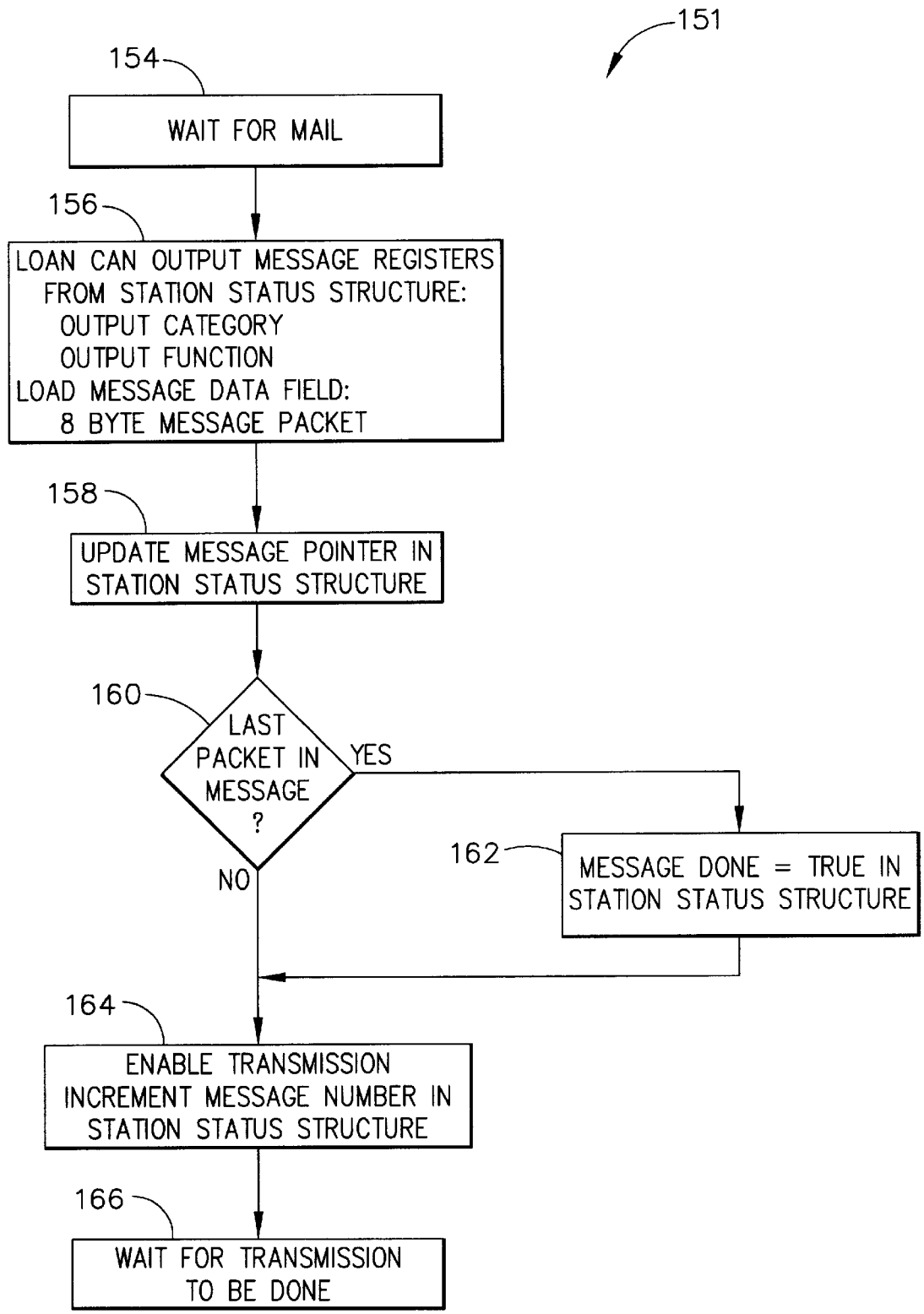

FIG. 4F shows a flow chart showing a task known as "CANXMT" 151, which is a particular task of output router 150. Function block 154 initially waits for a new mail message, and after one is received, function block 156 loads the CAN1 output message registers from the appropriate station status structure 192 with variables denoted as "output category" and "output function". In addition, an 8-byte message packet is created and loaded into the message data field. After that has occurred, function block 158 updates the message pointer in the appropriate station status structure 192, and if the overall message is longer than eight (8) bytes, the message pointer is indexed by eight (8) bytes to the next appropriate location in memory.

Decision block 160 determines if the last packet in the message to the CAN1 has been passed, and if the answer is YES, function block 162 sets a variable in the station status structure known as "MESSAGE_DONE to a value of TRUE (logic 1). At this point, function block 164 enables the transmission to the appropriate laboratory station and increments the message number in the appropriate station status structure. The logical flow is then directed to a function block 166 which waits for the transmission to be completed before sending the logical flow back to the beginning of this task (at function block 154).

Figure 4G:
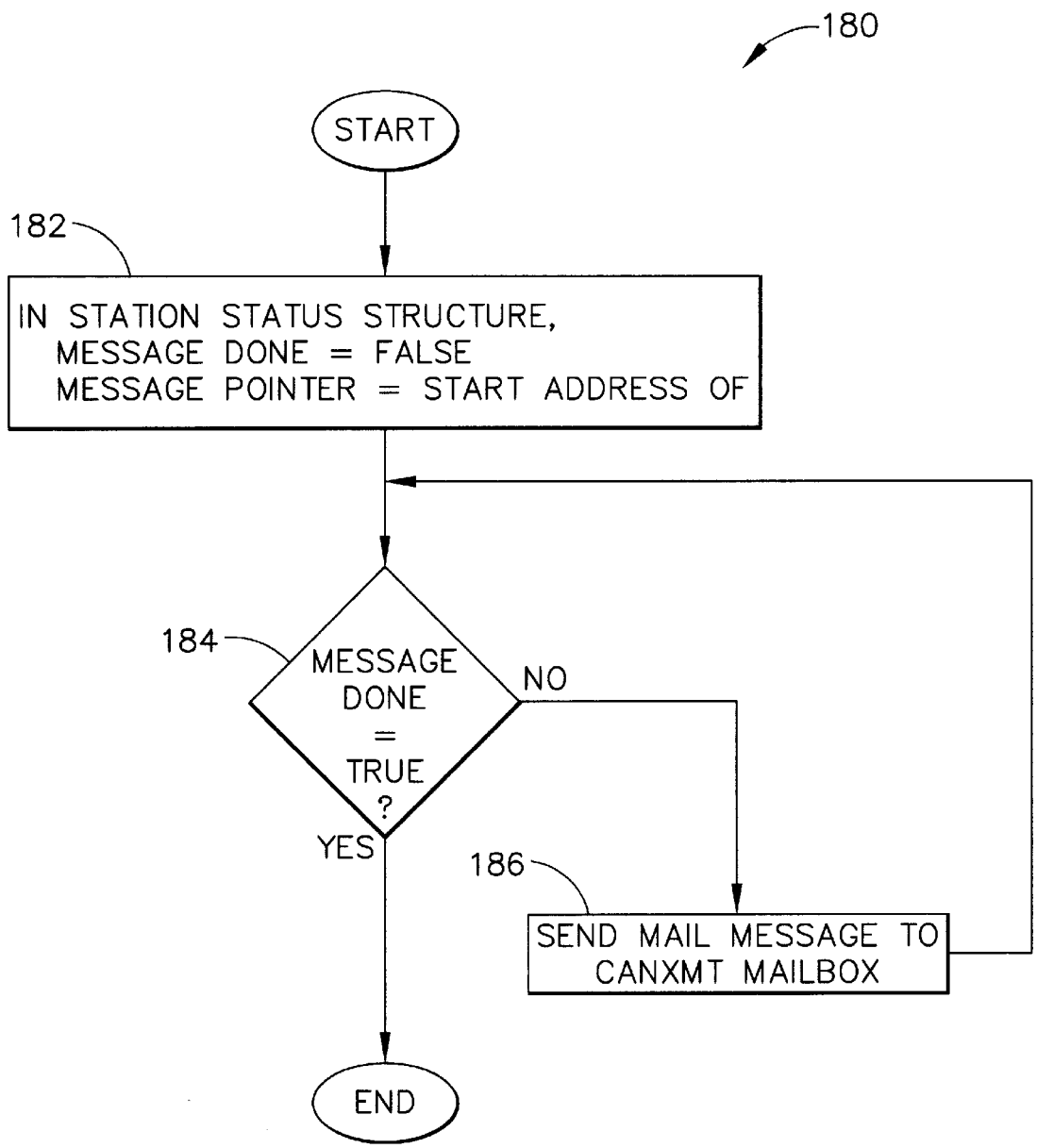

FIG. 4G shows a flow chart of the logical flow for sending a message to a laboratory station via the output router, which is also denoted as a "send_message_logic" operation block 180 of output router 150. In this sending message routine 180, function block 182 sets the "message done" variable equal to FALSE (logic 0) in the appropriate station status structure. The "message pointer" variable is set equal to the starting address of the string to be sent. At this point, the logical flow arrives at a decision block 184 which determines whether or not the message has been completed. This "send_message_logic" is incorporated in many places throughout the software of the illustrated network controller, and when the completed message has been sent, the logical flow is directed back to the remaining portions of the appropriate code. If decision block 184 determines that the message has not yet been completed, function block 186 sends a mail message to the CANXMT mailbox, which is a reminder to the CANXMT task 151 that it earlier started to send a particular message, but has never completed that particular message. Since the network controller uses a multi-tasking system, there could be several such messages that are incomplete at any given time, and the "send_message_logic" 180 merely "agitates" the CANXMT task into completing each of those incomplete messages.

The operational steps of an exemplary personality module 300 are depicted in FIGS. 7A, 7B, 7C, 7D, 7E, 7F, 7G, 7H, 7I, and 7J. FIGS. 7A–7E cover the initialization, menu process, and button press processes referred to in operation block 302 of a personality module 300 (see FIG. 4A) to emulate a pH meter. FIGS. 7F–7J cover the data manipulation operation block 304 of personality module 300 in FIG. 4A to emulate a pH meter.

The pH emulation initialization sequence of tasks is begun when the user of a laboratory emulation station 16 makes a main menu selection of "pH initialization with calibration", or "pH initialization without calibration". This selection is interpreted in the core router task 120 FIG. 4D. If "pH initialization with calibration" is selected, a mail message is sent by function block 132 on FIG. 4D to the mailbox of the PH_INIT1 task (see function block 312 on FIG. 7A). If "pH initialization without calibration" is selected, a mail message is sent by function block 132 on FIG. 4D to the mailbox of the PH_DISP_INIT task (see function block 382 on FIG. 7E) which bypasses the calibration steps in FIGS. 7A–7D described below.

Figure 7A:
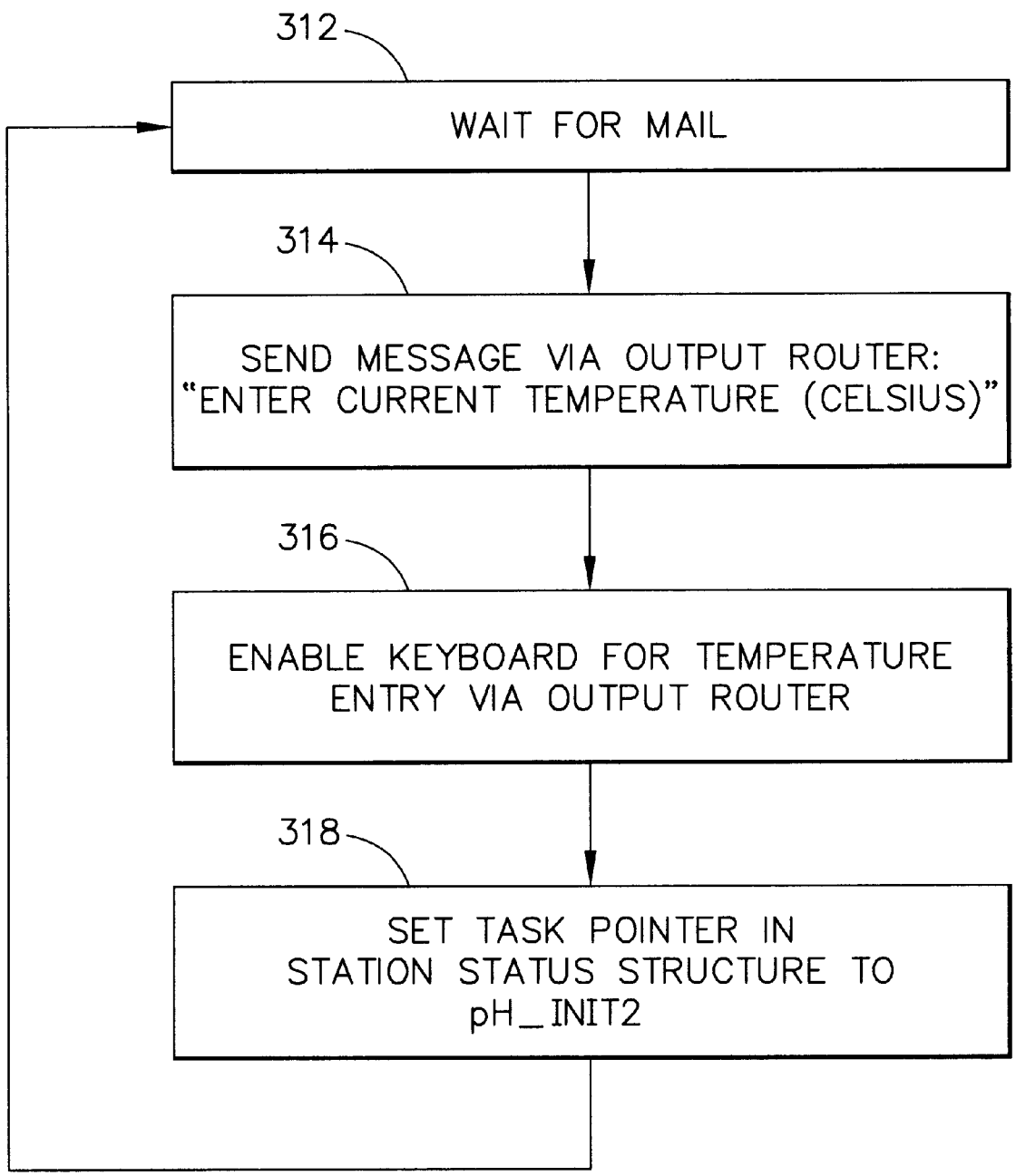
FIGS. 7A–7J are additional flow charts depicting other portions of the operating decisions of and controlling method of the instrument emulation network controller of FIG. 2.

An incoming mail message from core router 120 is received at function block 312 of the PH_INIT1 task 310 (see FIG. 7A). This message contains a pointer to the station status structure 192 associated with the station 16 requesting to 'become' a pH meter. At function block 314 a message is sent via output router 150 to the station asking the operator to enter the current temperature. Another message is sent at function block 316 enabling the station keyboard to allow entry of a temperature value. The task pointer of the station status structure 192 is then updated at function block 318 to point to the PH_INIT2 task. The logic flow is then directed back to function block 312 to await further mail messages.

Figure 7B:
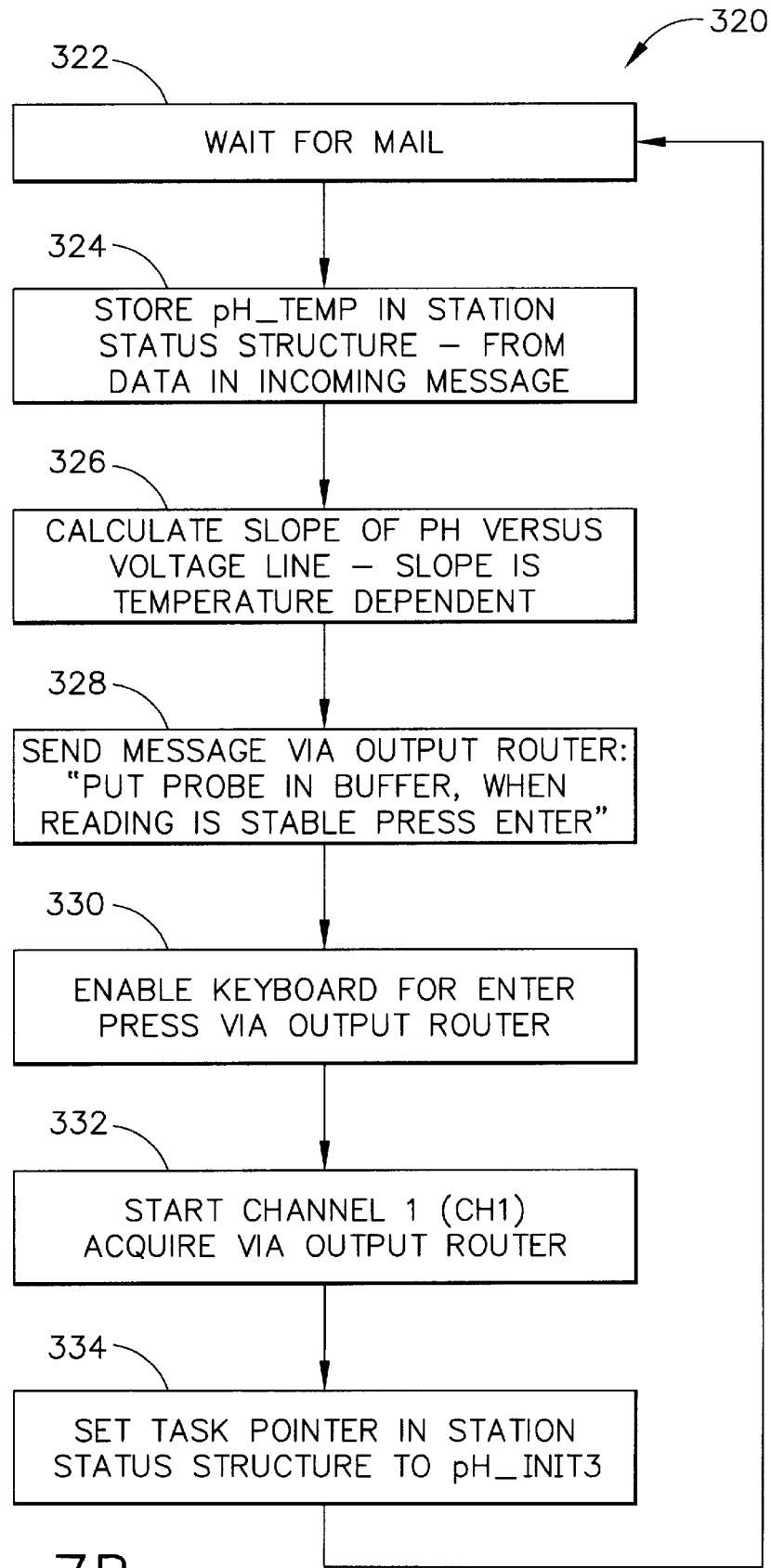

FIG. 7B illustrates the sequence of operations of the PH_INIT2 task 320, which is used to calibrate the PH probe at the laboratory station. At function block 322 the PH_INIT2 task waits for a mail message to arrive from the core router 120. At function block 324 the value for current temperature (stored in the station status structure by CAN-RCV 110, at function block 114 on FIG. 4C when the operator or user of the station responded to the request sent by function block 314 of FIG. 7A) is stored in the station status structure as "ph_temperature". This value is used at function block 326 to calculate the slope of the pH-versus-voltage relationship, which is temperature dependant. A pH probe outputs a voltage proportional to the pH of the solution in which the probe is immersed, so our laboratory instrument must convert this voltage to pH values to be displayed, and under certain conditions to be stored in memory (see below for greater details).

A message is sent to the laboratory station 16 via the output router 150 at function block 328 asking the user to place the pH probe connected to the input section of the A/D converter 62 of station 16 in a buffer solution with a known pH value. The user is further asked to wait until an interim pH reading (see below) shown on the display 70 is stable and then to press the "enter" key. A message is then sent to the station 16 via the output router 150 enabling the keyboard for an "enter" key press at function block 330. A further message follows immediately (at function block 332) which instructs the station to begin acquiring on channel 1. Finally at function block 334, the task pointer of the station status structure 192 is updated to point to the PH_INIT3 task. The logic flow is then directed back to function block 322.

Figure 7C:
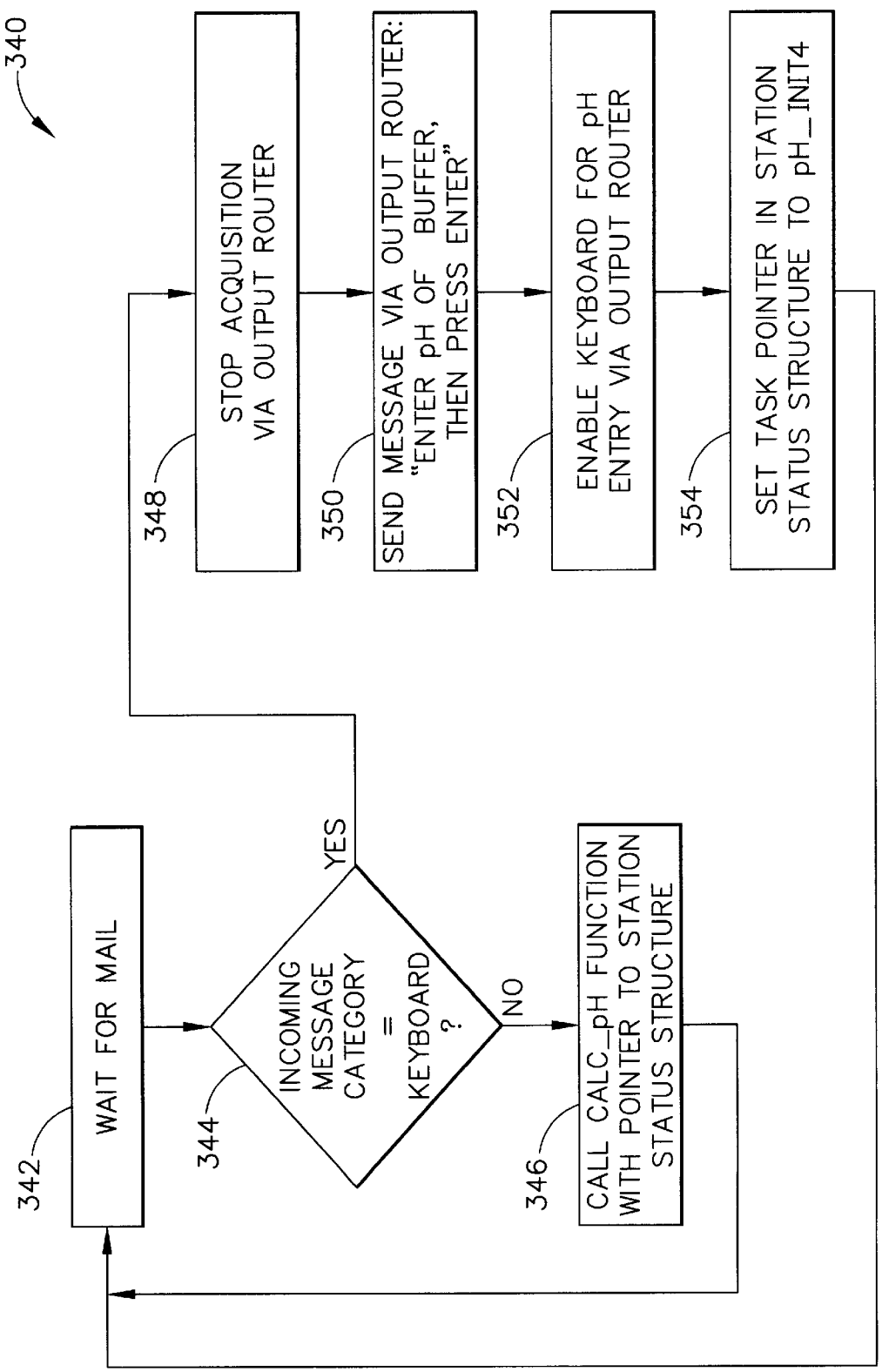
Figure 7D:
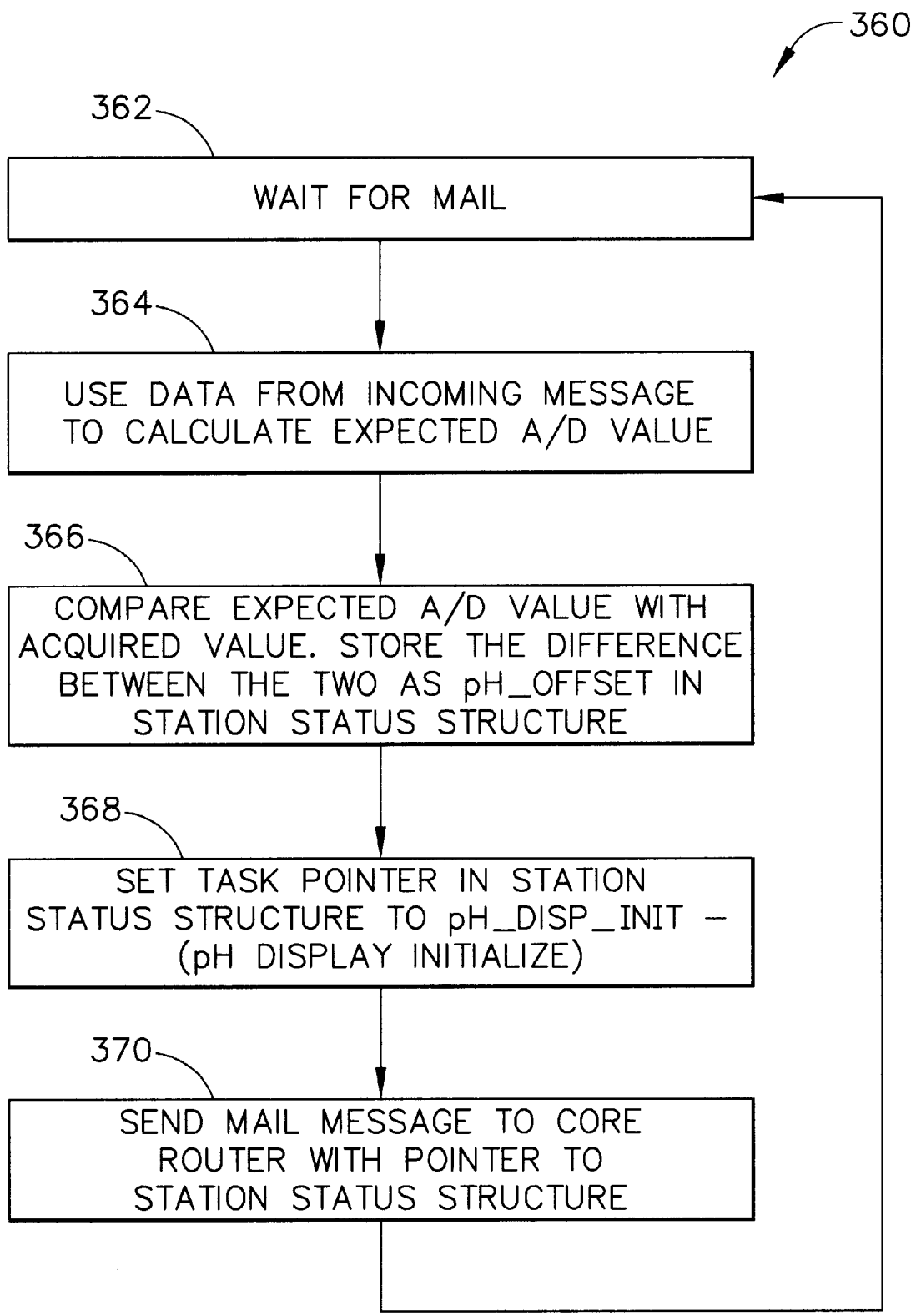
Figure 7E:
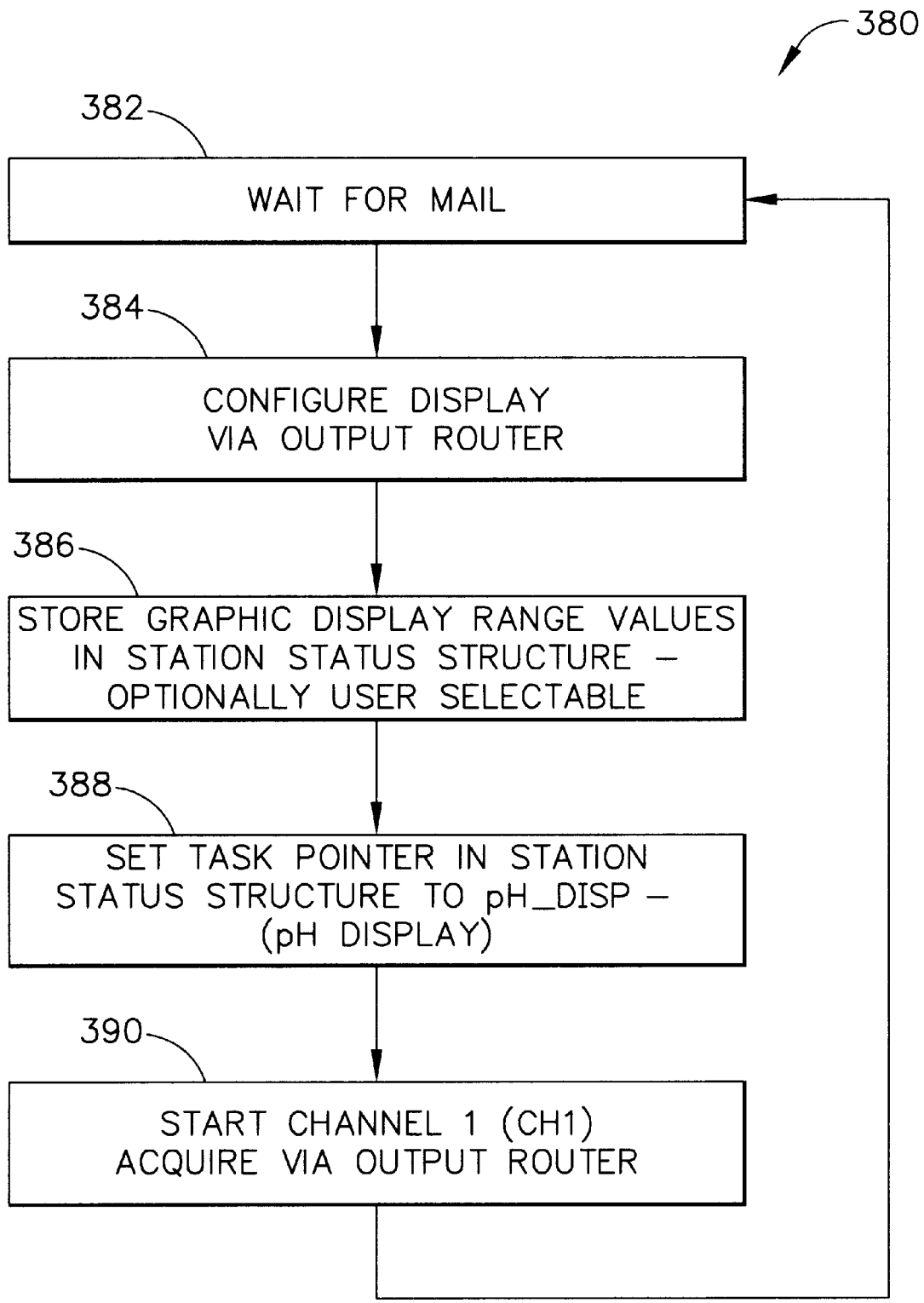

FIG. 7C illustrates the sequence of operations of the PH_INIT3 task 340. Function block 342 waits for a mail message to arrive from the core router task (FIG. 4D block 132). At decision block 344 the category of the incoming message stored in the station status structure is checked. If the category is "keyboard," the logic flow is directed to function block 348 where a "stop acquisition" instruction is sent to the station 16 via the output router 150. A message is then sent at function block 350 via the output router 150 asking the user to enter the pH of the buffer solution in which the pH probe was placed. A further instruction is sent to the station at function block 352 via the output router enabling the keyboard so that a pH value may be entered. The task pointer in the appropriate station status structure is set to PH_INIT4 at function block 354 and the logic flow is directed to function block 342 where the task awaits another mail message.

If the category of the incoming message at block 344 was not "keyboard," then the incoming message is the result of a data acquisition and the logic flow is directed to function block 346, where a function CALC_PH (see FIG. 7H and 7I, below) is called. A pointer to the appropriate station status structure is passed to the CALC_PH function. On return from the called function, the logic flow is directed to function block 342 where the task awaits another mail message.

In the PH_INIT4 task 360 (see FIG. 7D) the last of the calibration constants for pH acquisition is calculated. At function block 362 the task waits for a mail message to arrive. An incoming message will contain the pH value of the buffer requested in PH_INIT3. This value is converted at function block 364 to the same form as raw data from an A/D conversion. Function block 366 compares this expected A/D value to the actual acquired value which was stored in the station status structure by the PH_ACQ function (see below). The difference between these two values is stored in the station status structure as a "pH_offset" value, which will be used in all further pH calculations done by the CALC_PH function (see below). The task pointer of the appropriate station status structure is set to PH_DISP_INIT (pH display initialize) at function block 368, and function block 370 sends a mail message to the core router 120 with a pointer to station status structure 192 so that the logic flow will pass directly to the PH_DISP_INIT task.

After the forgoing sequence of initialization tasks has been executed, the PH_DISP_INIT task 380 (see FIG. 7E) will receive mail at function block 382 which was sent by PH_INIT4 block 370. If the user of emulation station 16 selected "pH initialization without calibration" at the main menu instead of "pH initialization with calibration", then function block 134 on FIG. 4D would have set the task pointer to PH_DISP_INIT and the calibration steps in FIGS. 7A–7D described above would have been bypassed. In this way the user of a station for which the attached probe had already been calibrated could proceed to using the station as a pH meter more quickly.

Figure 6:
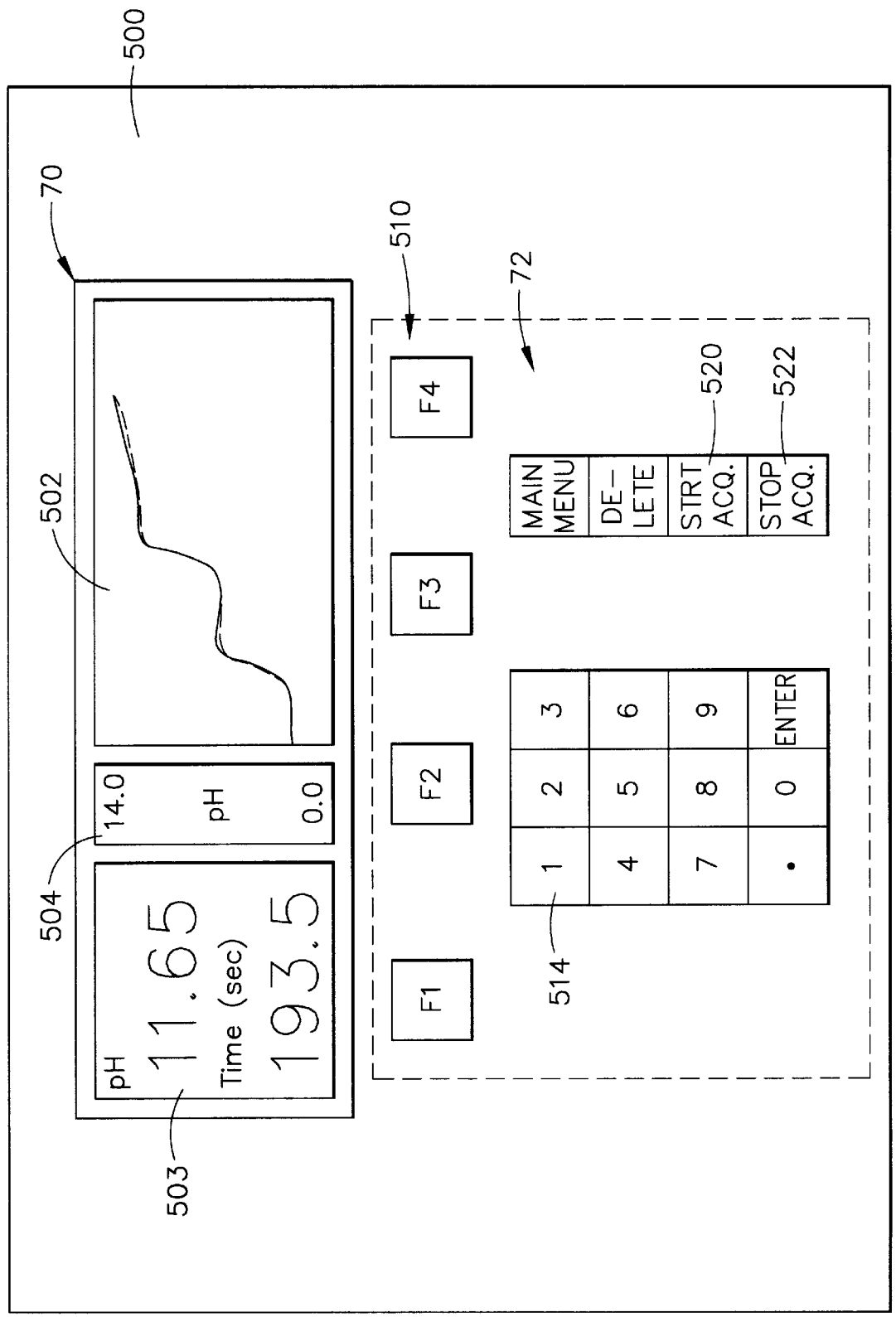
FIG. 6 is an illustration of a graphical display screen of one of the instrument emulation laboratory stations showing a simple application of the instrument emulation network system of FIG. 1 while performing a pH data collection problem.

At function block 384 a series of messages are sent to the station via the output router to configure the display. FIG. 6 shows the appearance of a pH display currently in use. At function block 386 the range limits for the graphic portion of the pH display 502 are stored in the appropriate station status structure 192. These values optionally can be user selectable. The task pointer of the station status structure is changed to PH_DISP (pH display) at function block 388. At function block 390 a message is sent to the station via the output router to start acquisition on channel 1. The logic flow is then directed to function block 382 to wait for mail.

Figure 7F:
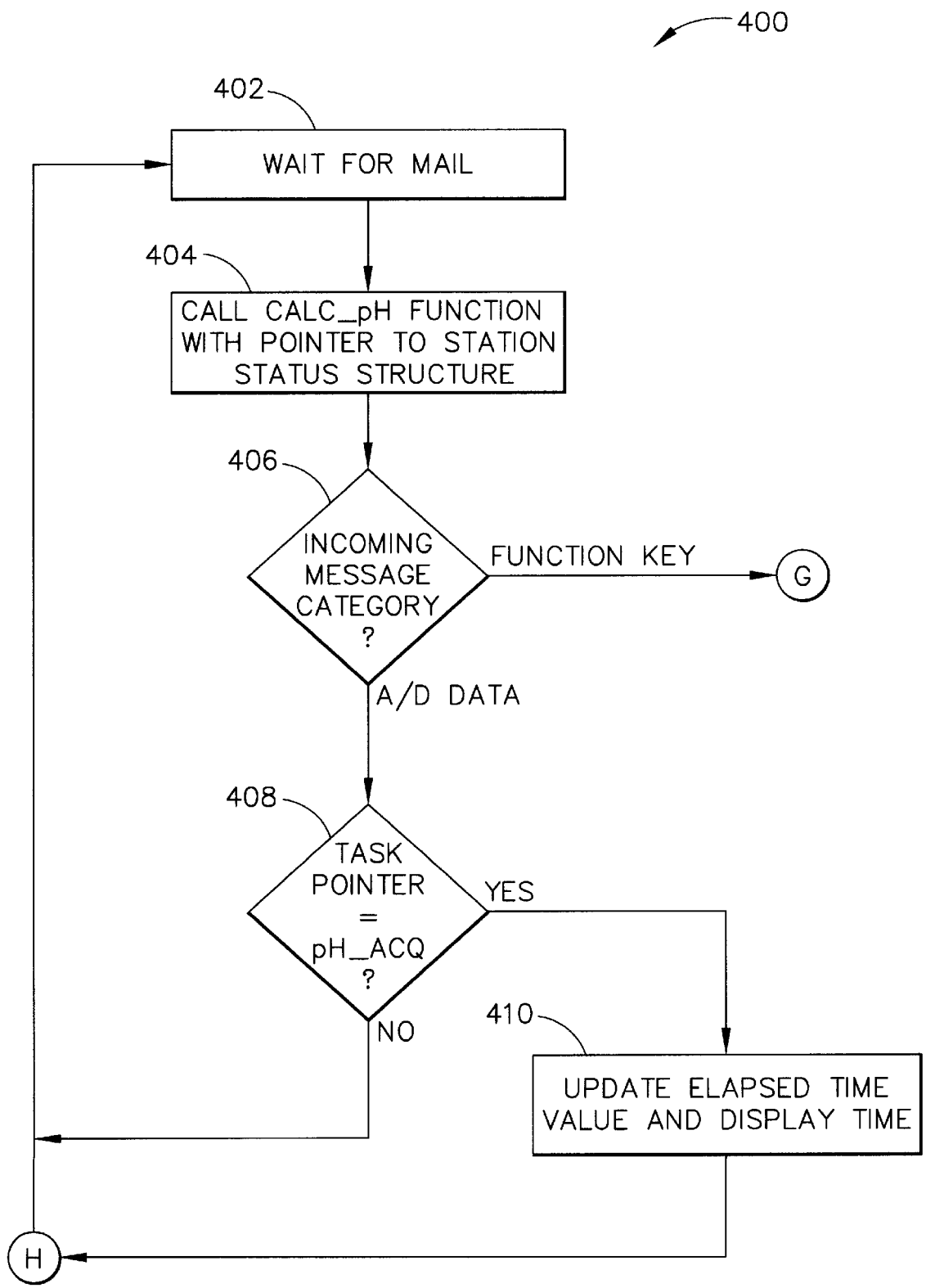
Figure 7G:
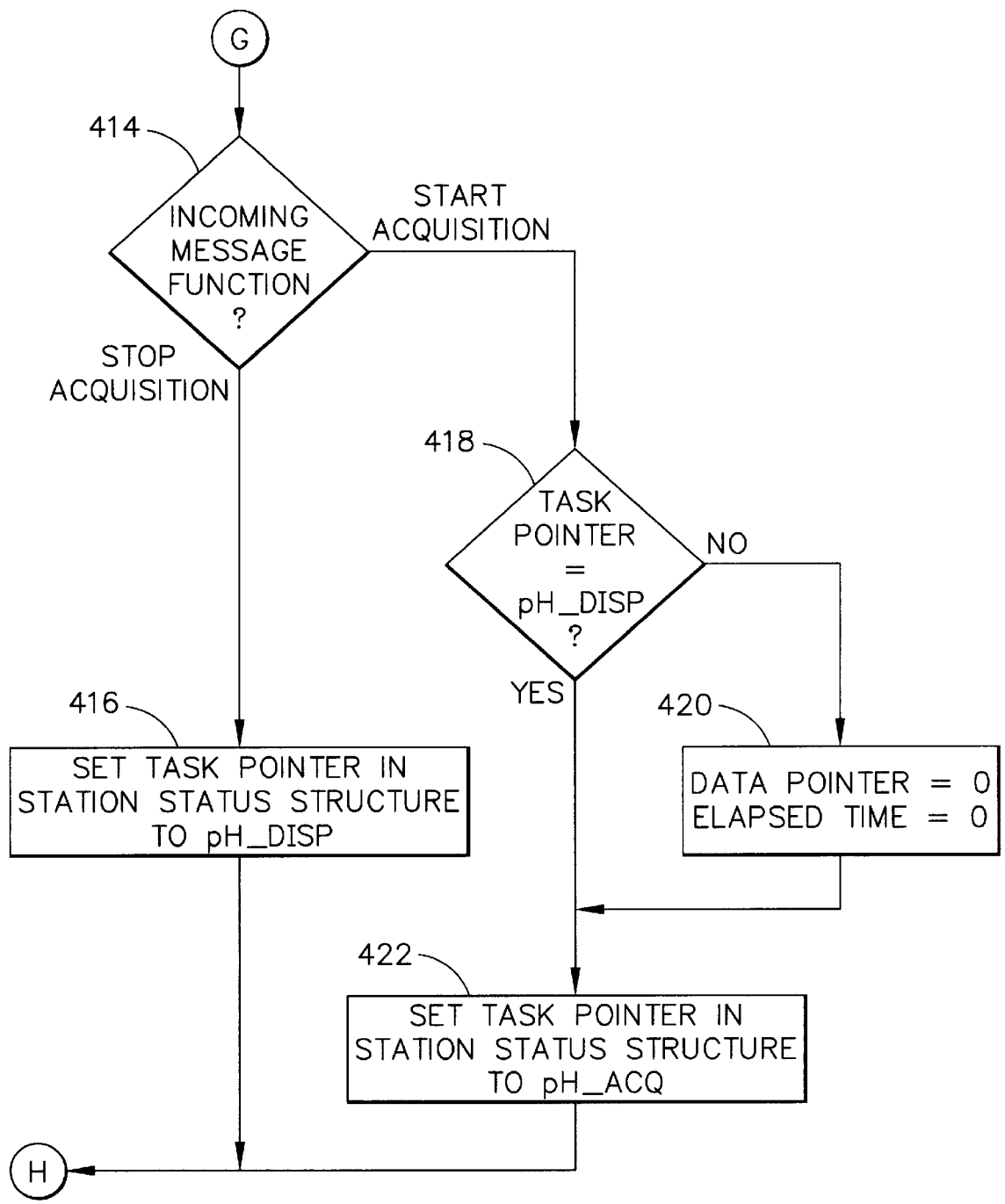

Another task of the pH personality module 300 is the PH_ACQ task 400 (pH acquisition) depicted in FIGS. 7F and 7G. This is also the beginning of the data manipulation operation block 304 as depicted in FIG. 4A. A discussion of the logic flow of PH_ACQ follows below, after which a detailed discussion of data manipulation block 304 commences.

There are two basic logic paths through the PH_ACQ task. If a function key (e.g., F1–F4—see index numeral 510 on FIG. 6) is pressed while the station is acquiring data, two of (eight) 8 possible function buttons are tested for: "STRT ACQ" (start acquisition) and "STOP ACQ" (stop acquisition), function keys 520 and 522, respectively, on FIG. 6. If STRT ACQ key 520 was pressed, pH values will be displayed in graphical form at display portion 502 (see FIG. 6), and the time display portion 503 (see FIG. 6) will be updated. Raw data from acquisitions will also be stored for later use in the bulk data area 196 until the end of an acquisition run is reached. If STOP ACQ key 522 is pressed, no further points will be displayed in the graphics portion 502 of the display and the time display 503 will no longer be updated. Nor will any more acquisition data be appended to the data stored in the bulk data area. When the display is initialized in PH_DISP_INIT 380 (FIG. 7E), the task pointer in the station status structure is set to PH_DISP, which also occurs when STOP ACQ key 522 is pressed. When the task pointer is set to PH_DISP, the PH_ACQ task only updates the numerical display of pH values at 503 of FIG. 6.

In FIG. 7F, the PH_ACQ task 400 begins with function block 402 where the task waits for incoming mail. At function block 404 the CALC_PH function (calculate pH) is called (see FIGS. 7H and 7I, below). A pointer to the appropriate station status structure 192 is passed to the function. The PH_ACQ task 400 waits for logic control to be returned by the called function. If the incoming message category is "A/D DATA," then decision block 406 directs the logic flow to a decision block 408. If the task pointer is not PH_ACQ, then decision block 408 directs the logic flow back to function block 402 to wait for new mail. If the task pointer is PH_ACQ at decision block 408, the value for elapsed time is updated in the station status structure 192 and the new value is sent in a message via the output router 150 to be displayed at the station display 70 as shown in the lower section of display portion 503 on FIG. 6.

If the incoming message category is FUNCTION KEY at decision block 406, the logic flow is directed to the letter "G" on FIGS. 7F and 7G. If the incoming message function (i.e., which function key was pressed) is STOP ACQUISITION at decision block 414, then the logic flow is directed to function block 416 where the task pointer in the station status structure 192 is set to PH_DISP which, as related above, will stop further graphing of incoming data, updating of the time display, and storage of data in the bulk data area 196. If the incoming message function (i.e., which function key was pressed) is START ACQUISITION at decision block 414, then the logic flow is directed to decision block 418. If the task pointer is PH_DISP at decision block 418, this means that an acquisition was not in progress and the user wishes to begin the timed acquisition process. The data pointer and elapsed time variables in the station status structure 192 are both set to zero at function block 420. At decision block 418, if the task pointer was not set to PH_DISP then the task pointer must already be set to PH_ACQ. At function block 422 the task pointer is set to PH_ACQ and the logic flow is directed to the letter "H" on FIG. 7F, and to function block 402 where the P_ACQ task waits for new incoming mail.

Figure 7H:
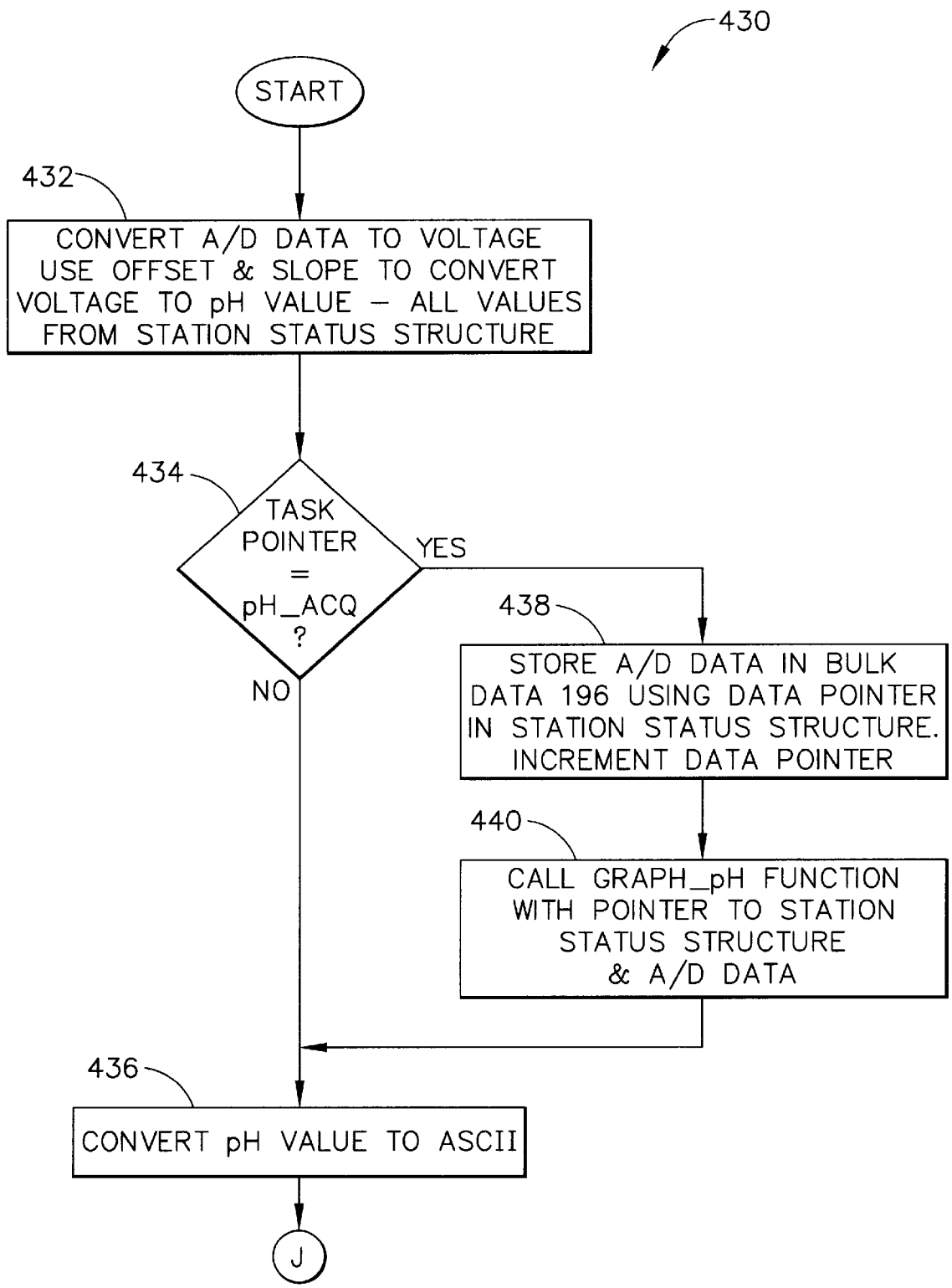
Figure 7I:
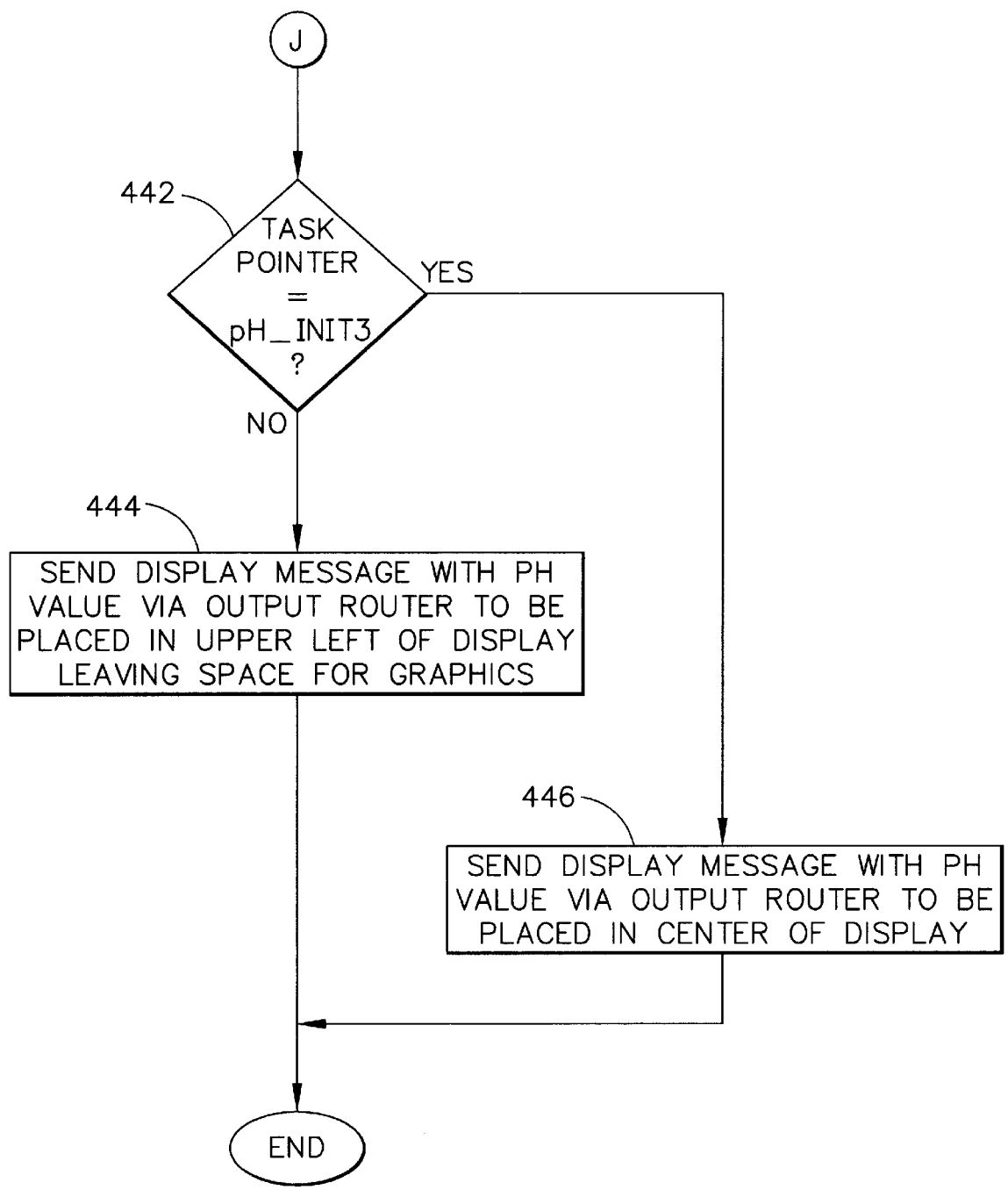
Figure 7J:
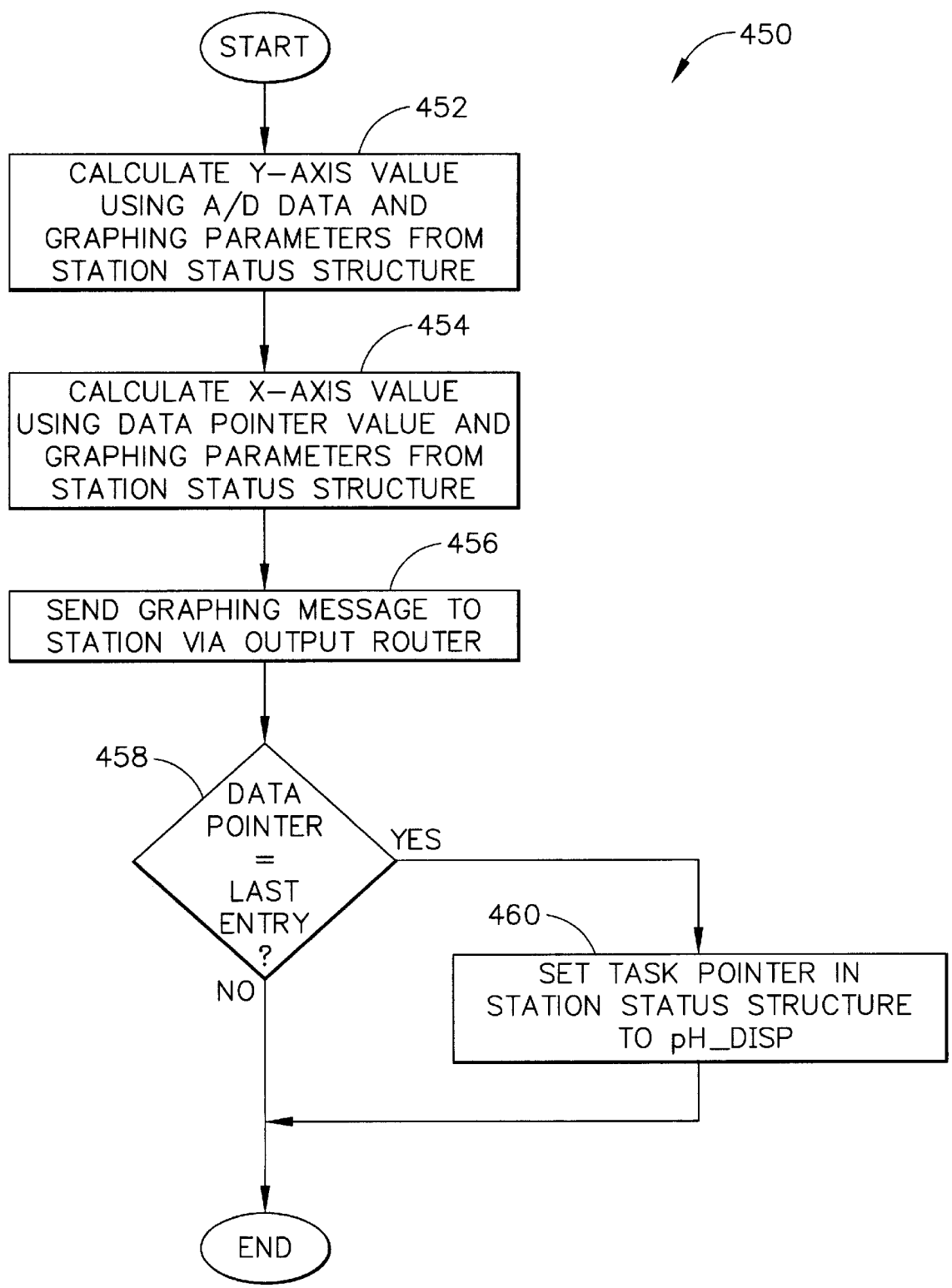

The following discussions describe the functions CALC_PH 430 on FIGS. 7H and 7I, and GRAPH_PH 450 on FIG. 7J. These are not tasks and as such do not run independently, nor are they controlled directly by the kernel. CALC_PH 430 is called by function block 404 of the PH_ACQ task 400 on FIG. 7F, and GRAPH_PH 450 is called by CALC_PH 430 (see below).

FIG. 7H illustrates the sequence of operating decisions when the CALC_PH function 430 is called by the PH_ACQ task 400. At function block 432, the raw A/D data stored in the appropriate station status structure 192 is converted to voltage units. The "ph_offset" value and slope values from the same station status structure are used to convert the voltage value to a pH value. If the task pointer from the station status structure at decision block 434 is PH_ACQ (meaning that the station is performing a timed acquisition run), the logical flow is directed to function block 438 where the raw data is stored in the bulk data area 196 using the data pointer in the station status structure. This data pointer is then incremented. In function block 440 the GRAPH_PH function 450 is called and a pointer to the station status structure 192 as well as the raw data is passed to it.

The logic flow is now directed to function block 436, including the situation where the task pointer was not PH_ACQ at decision block 434, and the pH value is converted to ASCII characters. The logic flow is now directed to the letter "J" on FIGS. 7H and 7I. At decision block 442, if task pointer is PH_INIT3 (which means the station is in the calibration process and interim pH values need to be displayed), the logic flow is directed to function block 446 where the pH value is sent in a display message, which contains display instructions to place the value in the center of the display at display portion 503, via the output router. If the task pointer is not PH_INIT3 at decision block 442, then the logic flow is directed to function block 444 where the pH value is sent in a display message which contains display instructions to place the value in the upper portion 503 of the display (see FIG. 6) via the output router. The logic flow in either case now is directed back to the calling task.

In FIG. 7J the sequence of operation decisions of the GRAPH_PH 450 function are shown. At function block 452 the A/D data passed when this function was called and the graphing parameters from the station status structure 192 are used to calculate a Y-axis value for graphing the current pH acquisition value. At function block 454 the data pointer value in the station status structure 192 (an indication of how much time has elapsed) and graphing parameters from the station status structure are used to calculate an X-axis value for graphing the current pH acquisition value. At function block 456 the X-axis and Y-axis values are sent in a display message to the laboratory station via the output router 150. At decision block 458 if the data pointer in the station status structure is pointing to the last allowable data address in the bulk data area for this station, then the logic flow is directed to function block 460 where the task pointer in the station status structure 192 is changed to PH_DISP, and the logic flow is directed back to the calling function. If at decision block 458 the data pointer does not point to the last allowable data address in the bulk data area for this station, then the logic flow is directed back to the calling function.

Figure 5A:
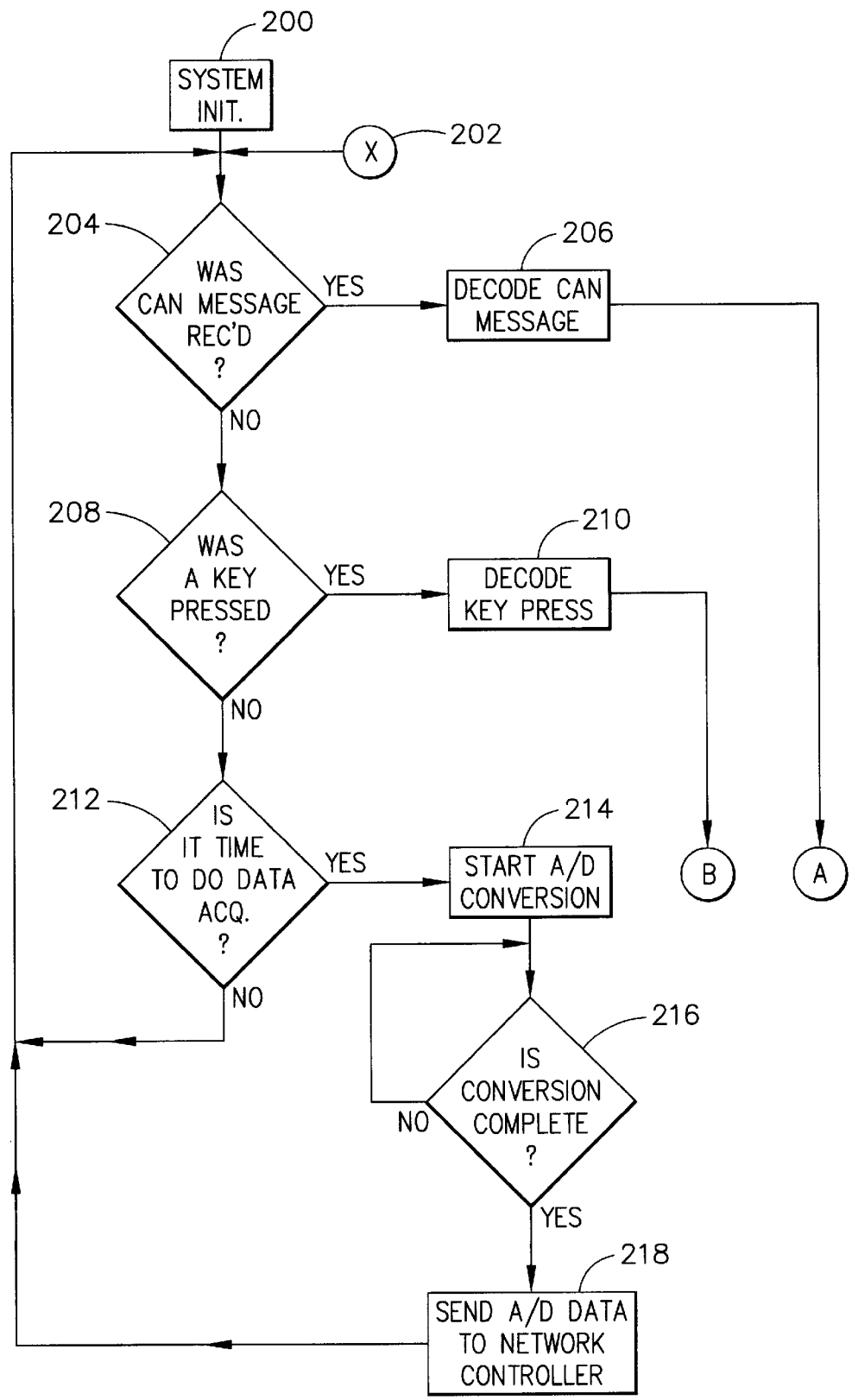
FIGS. 5A, 5B, 5C, and 5D are flow charts depicting the operating decisions and controlling method of the instrument emulation laboratory station of FIG. 3.

The operational steps of an exemplary laboratory station (i.e., one of stations 15–22) are depicted in flow chart form in FIGS. 5A, 5B, 5C, and 5D. The hardware depicted in FIG. 3 preferably includes a microprocessor (i.e., CPU 1) which functions according to software instructions preferably stored in its internal ROM. FIG. 5A depicts the laboratory station initialization and basic wait state events. CPU1 60 is the main processing device of the laboratory station 16. Upon startup, CPU1 60 initializes itself at function block 200 to communicate with the CAN 64, CPU3 74, FIFO 66, and the A/D converter 62. CPU1 60 also executes a series of commands to configure CAN 64 and A/D converter 62 and channels the flow of display data and station configuration commands to the appropriate hardware modules, i.e., the A/D converter, expansion port, CAN, and FIFO. Also during the station initialization phase, CPU3 74 configures itself as a keypad encoder and station power manager, and CPU2 78 configures itself as a graphics display data queue manager.

After initialization, CPU1 60 waits in a loop for an event to occur at the location 202 on Figure 5A, also designated by the letter "X." Three events are possible: (1) receipt of a CAN message, (2) receipt of a key press, or (3) a request for a data acquisition operation to start. When CAN 64 receives a message addressed to it, a flag is set in CAN 64 indicating that it has a message for CPU1 60. CPU1 60 periodically checks this flag at decision block 204, and if the flag is true, CPU1 60 will then read the message from CAN 64 at function block 206 and prepare for processing. CPU1 60 then reads a message from the CAN's message buffer and decodes it at function block 206 to see what function is being requested of the station. Such messages can include hardware configuration commands for A/D converter 62, and devices connected to expansion port 82. They can also include commands and data for graphic display 70 routed via the FIFO 86, CPU2 78, and CY325 graphics controller 80.

When a key is pressed on keypad 72 as determined by decision block 208, CPU3 74 decodes the key press at function block 210 and sends an interrupt to CPU1 60. CPU1 60 then sets a flag indicating that a key has been pressed and reminds CPU1 60 that it has keypad data to be processed at a later time. When CPU1 60 sees that the key press flag has been set, it reads the key value from CPU3 74 via the SPI BUS 68. CPU1 60 then decodes the keypad data to determine whether an alpha-numeric key or a function key was pressed.

CPU1 60 checks to see if the data acquisition flag has been set at decision block 212, and if so, indicating that it is time for the A/D converter 62 to perform a conversion. If the flag was not set, CPU1 60 returns to a wait state. If the flag was set, CPU1 60 directs A/D converter 62 to perform a data conversion, which either can be a single channel conversion of the dual channels "CH1" or "CH2" of A/D converter 62, or a dual channel conversion CH1 and CH2. Many various types of input sensors (i.e., sensor 63 on FIG. 3) can be connected to either CH1 or CH2, examples of such sensors being: a pH probe, voltage probe, temperature sensor, pressure sensor, proximity sensor or optical sensor acting as a front-end input for a drop-counter, front-end sensor of a colorimeter, or conductivity probe. It will be understood that the expansion port 82 would typically be used to provide power for and control the operation of the more complicated types of sensing devices, such as the drop-counter and the colorimeter.

Once the conversion has started at function block 214, CPU1 60 waits for A/D converter 62 to indicate that the conversion is complete at decision block 216. CPU1 60 then reads the binary result from A/D converter 62 via the SPI BUS 68. After CPU1 60 receives the binary data from A/D converter 62, it formats the data into a message that will be loaded into CAN 64. This message contains the A/D conversion result and the station number. The CAN 64 then sends the message, at function block 218, to the network controller 12 for processing and storage at the network controller.

Figure 5B:
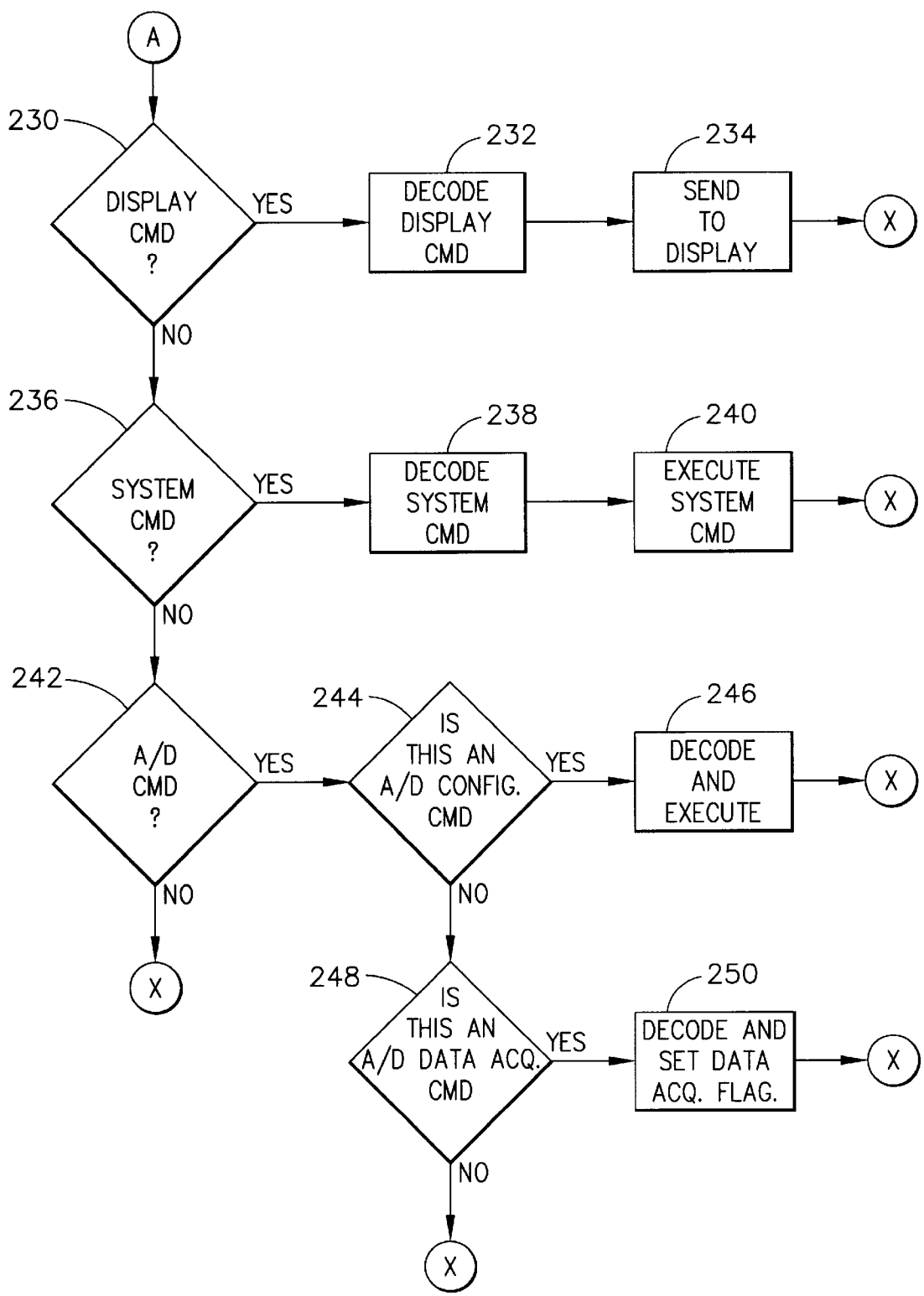

FIG. 5B illustrates the sequence of operating decisions which follow the receipt and decoding of a CAN message, and follows from the logical flow at the letter "A" on FIG. 5A. Three types of messages can be received: display commands, system commands, and A/D commands. CPU1 60 first checks the message received to see if it is a display message at decision block 230, and if so, CPU1 60 stores the contents in the FIFO 66. CPU2 78 constantly checks the FIFO 66 to see if it has data. There are two categories of display messages: (1) Display Command/Data messages, which are read from the FIFO 66 by CPU2 78 and then sent to the CY325 80 which forwards them to the graphic LCD 70, and (2) Display Macros, which are read into CPU2 78, decoded into a series of commands that are then sent to the CY325 80, and further sent on to the graphic LCD 70. The commands and data received by the CY325 80 are decoded at function block 232 and put in a format acceptable to the graphic LCD 70, then displayed at function block 234. This can be text or graphical information. CPU1 60 then returns to the main wait state at the letter "X," depicted in FIG. 5A as step 202.

If the message is not a display message, CPU1 60 then checks the message received to see if it is a system command at decision block 236, and if so, it is forwarded to the system message decoder. The system message decoder at function block 238 decodes messages used to reconfigure the station hardware, which could affect all hardware depicted in FIG. 3 except for the A/D converter 62. Station system messages include setting the timer interrupt period, changing the CAN 64 communication rate, and configuring devices connected to expansion port 82. Once a message is decoded, it is passed on to the appropriate system command software module to be executed at function block 240. CPU1 60 then returns to the main wait state at letter "X," also depicted in FIG. 5A as step 202.

If the message is neither a display message nor a system command, CPU1 60 checks the message received at decision block 242 to see if it is an A/D command, and if so, CPU1 60 determines if an A/D configuration command is being requested at decision block 244. An A/D configuration command can include calibration, offset, gain, filter bandwidth, and resolution commands, and this command is decoded and executed at function block 246. If an A/D configuration command is not being requested, CPUI 60 checks at decision block 248 to see if the message received is an A/D data acquisition command, which can include a single channel data acquisition, A/D CH1 or CH2, and a dual channel data acquisition, A/D CH1 and CH2. This command is decoded and the proper flag is set for later execution at function block 250. CPU1 60 then returns to the main wait state at the letter "X," also depicted in FIG. 5A as step 202.

Figure 5C:
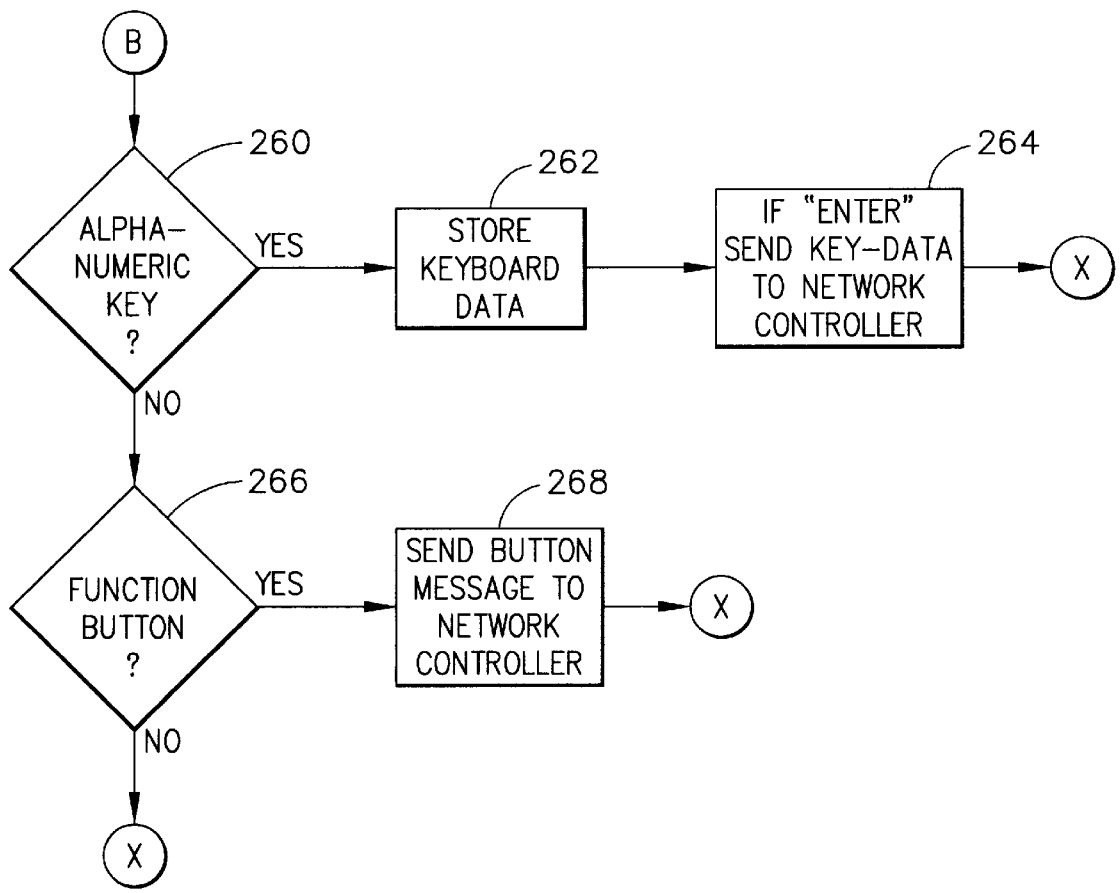
Figure 5D:
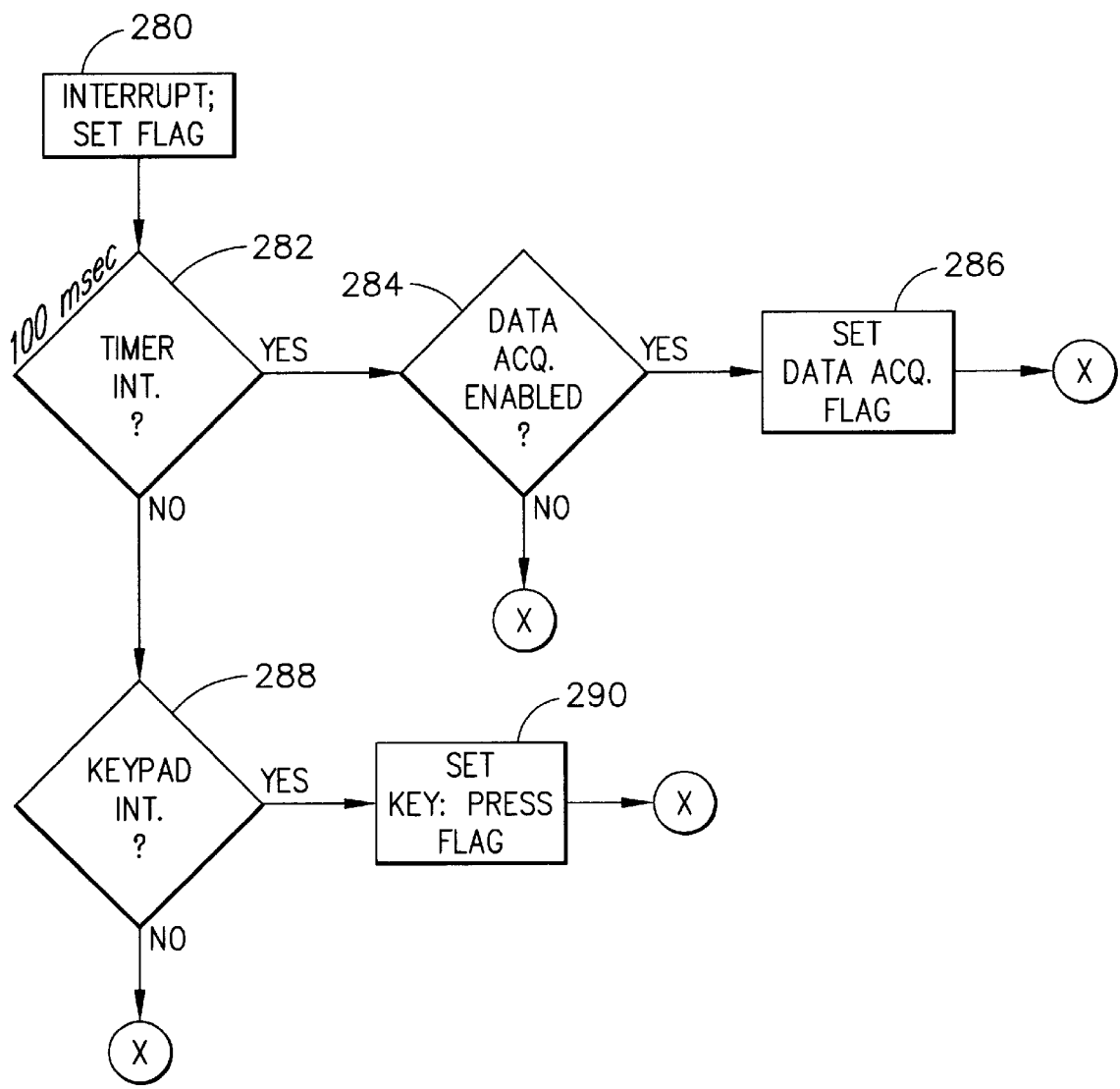

FIG. 5C illustrates the sequence of operating decisions which follow the receipt and decoding of a key press and follows from the logical flow at the letter "B" on FIG. 5A. Two types of keys can be pressed: (1) alpha-numeric keys, and (2) function keys. CPU1 60 first checks to see if the key that was pressed was an alpha-numeric key at decision block 260, and if so, CPU1 60 stores the data value in the keypad data array at function block 262, and the data value will be sent to the network controller 12 at a later time. When CPU1 60 sees that the "Enter" key was pressed at function block 264, it creates a message containing the keypad data array, thereby indicating which station the message was from. CPU1 then sends the keypad data array a message via CAN 64 at function block 264, to the network controller 12 for storage or processing. CPU1 60 then returns to the wait state at the letter "X," also depicted in FIG. 5A as step 202.

If the key pressed was not alpha-numeric, CPU1 60 checks to see if a function key was pressed, at decision block 266, and if so, the data value of this function key is sent to the network controller 12 via the CAN 64 at function block 268 for processing at the network controller. Because the station 16 can be emulating a variety of instruments, the function buttons can represent different commands at different times, and only the network controller 12 keeps track of this information in the illustrated embodiment. CPU1 60 then returns to the wait state at the letter "X," also depicted in FIG. 5A as step 202.

FIG. SD depicts the sequence of events that follows the occurrence of a timer interrupt or keypad interrupt. When an interrupt occurs, the interrupt flag is set in CPU1 60 at function block 280. CPU1 60 first checks to see if a timer interrupt has occurred, at decision block 282. In the illustrated embodiment, a timer interrupt occurs every 100 msec. Once CPU1 60 has determined a timer interrupt has occurred, it checks to see if the data enable flag is set at decision block 284. If so, CPU1 60 checks to see if the data acquisition period of 0.5 seconds has been reached, and when that has occurred, CPU1 60 sets the data acquisition flag, indicating that A/D converter 62 should start a data conversion at function block 286. CPU1 60 then returns to the wait state at the letter "X", also depicted in FIG. 5A as step 202.

If the interrupt is not a timer interrupt, CPU1 60 checks to see if the keypad caused the interrupt, at decision block 288. If so, CPU1 60 sets the key press flag at function block 290, indicating that a key press has occurred. CPU1 60 then returns to the wait state at the letter "X," also depicted in FIG. SA as step 202.

FIG. 6 is an illustration of the front panel 500 of a laboratory station which includes the graphic LCD display 70 and keypad 72. The LCD screen is depicting a simple application of the instrument emulation network system 10, which is currently displaying a pH titration experiment. In this experiment, graphic display 70 is divided into three sections: a left section 503 showing the pH value at the top and the time at the bottom during a particular point in the experiment; a center section 504 showing the scale of the pH range 0–14; and a larger right section 502 showing a graphical plot of the data collected by the laboratory station in real time.

It will be understood that the hardware configuration of the network controller, the laboratory stations, and the network itself can be modified significantly without departing from the principles of the present invention.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

We claim:

1. A laboratory instrument emulation network for measuring physical parameters at a plurality of laboratory stations, each station utilizing one or more sensors that make up a single scientific instrument, and each station displaying data collected at that laboratory station, said laboratory instrument emulation network comprising:

(a) a network controller having a first processing unit with associated memory, said first processing units memory configured to remember the configuration of each said laboratory stations and store real-time raw data acquired by each of said laboratory stations a first communications controller circuit, said first communications controller circuit being in communication with said first processing unit and having a first input/output driver/receiver circuit, and said network controller capable of converting said raw data to converted data, and transmitting said converted data to the appropriate laboratory station;

(b) a plurality of laboratory stations each including a second processing unit, a second communications controller circuit, said second communications controller circuit being in communication with said second processing unit and having a second input/output driver/receiver circuit, a display with associated display controller that is in communication with said second processing unit, an operator input interface that is in communication with said second processing unit, a physical input interface circuit that is in communication with said second processing unit; and (c) a communications network that provides communication pathways between said first input/output driver/receiver circuit and each of said plurality of second input/output driver/receiver circuits;

wherein each of said laboratory stations is configurable to perform as more than one type of laboratory instrument, said network controller determining the configuration of each said laboratory station and causing said laboratory station to perform as at least one type of laboratory instrument.

2. The laboratory instrument emulation network as recited in claim 1, wherein said first processing unit comprises a microcontroller integrated circuit.

3. The laboratory instrument emulation network as recited in claim 1, further comprising at least one external sensor that is in communication with one of said plurality of physical input interface circuits.

4. The laboratory instrument emulation network as recited in claim 1, wherein said first communication circuit includes a standard communications protocol that manages all messages between said network controller and said plurality of laboratory stations.

5. The laboratory instrument emulation network as recited in claim 1, wherein the operation of said second processor's computer program includes a set-up mode, a calibration mode, a real-time data acquisition mode, and provides alphanumeric and graphical data in real-time to said display.

6. The laboratory instrument emulation network as recited in claim 1, wherein each of said laboratory station's second processing unit comprises a microcontroller, said second communications controller circuit comprises a standard communications protocol that manages all messages between said network controller and its respective laboratory stations, said display comprising a graphical display that also depicts alphanumeric characters, said operator input interface comprising a keypad, and said physical input interface circuit comprising an analog-to-digital converter.

7. The laboratory instrument emulation network as recited in claim 1, wherein said communications network is a bi-directional, high-speed serial data system.

8. The laboratory instrument emulation network as recited in claim 1, wherein said laboratory station is configurable to emulate at least one laboratory measuring instrument.

9. The laboratory instrument emulation network as recited in claim 8, wherein said laboratory station configuration comprises one of a pH meter, voltmeter, temperature sensor, pressure sensor, drop-counter, colorimeter, and conductivity sensor.

10. The laboratory instrument emulation network as recited in claim 1, wherein said first processor's program is a multi-tasking system using a kernel that processes tasks in real-time according to the priority assigned to each said task.

11. A laboratory instrument emulation network, for measuring physical parameters at a plurality of laboratory stations, each station utilizing one or more sensors that make up a single scientific instrument, and each station displaying data collected at that laboratory station, said laboratory instrument emulation network comprising:

(a) a network controller having a first processing unit with associated memory, a first communications controller circuit, said first communications controller circuit being in communication with said first processing unit and having a first input/output driver/receiver circuit;

(b) a plurality of laboratory stations each including a second processing unit, said second processing unit including a computer program that operates upon instructions received from said network controller that configures said respective laboratory stations and commands said laboratory stations to begin acquiring data in real time, said laboratory stations then sending the acquired raw data to said network controller, said laboratory stations later receiving converted data from said network controller and displaying said converted data upon a display, a second communications controller circuit, said second communications controller circuit being in communication with said second processing unit and having a second input/output driver/receiver circuit, said display associated with a display controller that is in communication with said second processing unit, an operator input interface that is in communication with said second processing unit, a physical input interface circuit that is in communication with said second processing unit; and (c) a communications network that provides communication pathways s between said first input/output driver/receiver circuit and each of said plurality of second input/output driver/receiver circuits;

wherein each of said laboratory stations is configurable to perform as more than one type of laboratory instrument, said network controller determining the configuration of each said laboratory station and causing said laboratory station to perform as at least one type of laboratory instrument.

12. A method of measuring physical parameters detected by one or more sensors that make up a single scientific instrument at a laboratory station, acquiring raw data, and displaying the associated converted data at each of a plurality of laboratory stations, said method comprising the steps of:

(a) providing a network controller having a first processing unit with associated memory and said first processing unit in communication with a first communications controller circuit;

(b) providing a plurality of laboratory stations each having a second processing unit and a display, an operator input interface, a physical input interface circuit, and a second communications controller circuit each in communication with said second processing unit;

(c) selecting the type of scientific instrument that will be emulated at each of said plurality of laboratory stations in use;

(d) repeatedly acquiring data in real-time at said plurality of laboratory stations corresponding to a physical parameter, thereby creating a plurality of raw data signals, each signal having a sequential series of values;

(e) communicating the value of each said raw data signal for a particular time interval and for a particular laboratory station to said network controller;

(f) storing each said received value of said raw data signal in a memory of said first processing unit;

(g) converting each said raw data signal into an appropriate converted signal;

(h) communicating at least one value of each said converted signal from said network controller to at least the laboratory station that provided the raw data signal that was converted into said converted signal; and (i) displaying at said laboratory station providing said raw data signal in near real-time said at least one value of said converted signal associated with said laboratory station providing said raw data signal.

13. The method as recited in claim 12, wherein the step of displaying the value of said converted signal is in a textual format.

14. The method as recited in claim 12, wherein the step of displaying the value of said converted signal is in a graphical format.

15. The method as recited in claim 12, further comprising the steps of repeatedly acquiring data in real-time at said plurality of laboratory stations corresponding to a second physical parameter, thereby creating a second raw data signal having a sequential series of values; communicating the value of said second raw data signal for a particular time interval to said network controller; storing each said received value of said second raw data signal in an associated memory of said first processing unit; converting each said second raw data signal into an appropriate second converted signal; communicating at least one value of said second converted signal to at least one laboratory station from said network controller; and displaying at said at least one laboratory station in near real-time said at least one value of said second converted signal.

16. A laboratory instrument emulation network comprising:

a network controller, said network controller comprising:
a first processing unit;
a memory, said memory in communication with said first processing unit, said memory containing an operating system and at least one personality module; and
a first communications controller circuit, said first communications controller circuit being in communication with said first processing unit and having a first input/output driver/receiver circuit;

a plurality of laboratory stations, each said laboratory station comprising:
a second processing unit with associated memory;
a second communications controller circuit, said second communications controller circuit being in communication with said second processing unit and having a second input/output driver/receiver circuit;
a display with associated display controller that is in communication with said second processing unit;
a keypad with associated keypad controller that is in communication with said second processing unit;
an analog to digital conversion circuit that is in communication with said second processing unit; and a communications network that provides communication pathways between said first input/output driver/receiver circuit and each of said plurality of second input/output driver/receiver circuits;

wherein each of said laboratory stations can emulate one of the plurality of scientific instruments for which personality modules are stored in said memory of said network controller, each said laboratory station capable of selecting one of said plurality of scientific instrument, thereby determining the configuration and personality of said laboratory station, each said laboratory station sending acquired data and control messages to said network controller, said network controller storing and processing said acquired data and control messages, said acquired data from said station is processed using said personality module selected for said lab station, said processed data transmitted over said communications network to said laboratory station for display on said display.

17. The laboratory instrument emulation network as recited in claim 16, further comprising at least one external sensor that is in communication with said analog to digital conversion circuit.

18. The laboratory instrument emulation network as recited in claim 16, wherein said laboratory station further comprises a instrument interface expansion port in communication with said second processing unit.

19. The laboratory instrument emulation network as recited in claim 16, wherein said network controller further comprises a serial communications interface circuit, whereby said network controller may communicate with a personal computer.

* * * * *

UNITED STATES PATENT AND TRADEMARK OFFICE
CERTIFICATE OF CORRECTION

PATENT NO. : 5,946,471
DATED : August 31, 1999
INVENTOR(S) : Robert Thomas Voorhees, Paul Ardeshir & Estel Dean Sprague It is certified that error appears in the above-indentified patent and that said Letters Patent is hereby corrected as shown below:

Column 17, line 17 (claim 1 (a)) please insert --,-- directly after the word "stations"
Column 18, line 21 (claim 11) please delete --,-- directly after the word "network"
Column 18, line 53 (claim 11 (c)) please delete --s-- directly after the word "pathways"

Signed and Sealed this

Nineteenth Day of September, 2000

Attest:

Q. TODD DICKINSON

*Attesting Officer*          *Director of Patents and Trademarks*